United States Patent [19]

Ikeda et al.

[11] 4,197,124

[45] Apr. 8, 1980

[54] NON-TREATMENT TYPE PLANOGRAPHIC PRINTING PLATE MATERIALS

[75] Inventors: Tomoaki Ikeda; Yuzo Mizobuchi; Fumiaki Shinozaki; Akira Nahara; Yoshihiro Ono; Yasuo Washizawa; Satoshi Yoshida; Takeshi Tomotsu, all of Asaka, Japan

[73] Assignee: Fuji Photo Film Co., Ltd., Minami-ashigara, Japan

[21] Appl. No.: 875,708

[22] Filed: Feb. 6, 1978

Related U.S. Application Data

[63] Continuation-in-part of Ser. No. 709,744, Jul. 29, 1976, abandoned.

[30] Foreign Application Priority Data

Jul. 29, 1975 [JP] Japan ................................ 50-92391

[51] Int. Cl.$^2$ .......................... G03C 1/76; G03F 7/02

[52] U.S. Cl. .................................. 430/302; 430/345; 430/540; 430/566; 430/564; 430/524; 430/526; 430/531; 430/538; 430/570; 430/581; 430/932; 430/547; 430/560

[58] Field of Search ........................ 96/92, 75, 88, 1.5, 96/94 BF, 108, 90 PC, 67, 86 R, 87 R, 107, 98 OP, 95, 33, 85, 97, 99, 77

[56] References Cited

U.S. PATENT DOCUMENTS

| | | | |
|---|---|---|---|
| T864,011 | 7/1959 | Herz | 96/108 |
| 1,574,944 | 3/1926 | Sheppard | 96/107 |
| 3,615,559 | 10/1971 | Kaspaul | 96/88 |
| 3,660,086 | 5/1972 | Tamai et al. | 96/90 PC |
| 3,684,509 | 8/1972 | Heuvel et al. | 96/88 |
| 3,707,372 | 12/1972 | Hallman et al. | 96/1.5 |
| 3,762,325 | 10/1973 | Hallman et al. | 96/33 |
| 3,852,067 | 12/1974 | Levy | 96/94 R |
| 3,907,566 | 9/1975 | Inoue et al. | 96/88 |

*Primary Examiner*—Won H. Louie, Jr.
*Attorney, Agent, or Firm*—Sughrue, Rothwell, Mion, Zinn and Macpeak

[57] ABSTRACT

A planographic printing plate material comprising a support and a light sensitive layer provided on the support, the light-sensitive layer being composed of (A) an inorganic material; (B) at least one metal and/or metal compound [(A)/(B) are capable of reacting with each other upon application of electromagnetic radiation] and (C) an organic compound capable of affecting the reaction between the inorganic material (A) and the metal and/or metal compound (B), wherein the inorganic material (A), the metal or metal compound (B), and the organic compound (C) are in contact with each other. When the light-sensitive layer is exposed to electromagnetic radiation, a difference in the hydrophilic or oleophilic nature of the exposed areas and the unexposed areas results, whereby a planographic printing plate is obtained which can be mounted on a printing machine and printed without any other treatments.

31 Claims, 14 Drawing Figures

NON-TREATMENT TYPE PLANOGRAPHIC PRINTING PLATE MATERIALS

CROSS REFERENCE TO RELATED APPLICATIONS

This application is a continuation-in-part application of copending application, Ser. No. 709,744, filed July 29, 1976, now abandoned.

BACKGROUND OF THE INVENTION

1. Field of the Invention

This invention relates to a planographic printing plate material (i.e., a lithographic printing plate), more particularly, to a non-treatment type planographic printing plate material which can be mounted on a printing machine and printed without applying any treatment after exposure.

2. Description of the Prior Art

In this specification, a material for producing a planographic printing plate i.e., the material before exposure to light, and a planographic printing plate produced from the material are called a "planographic printing plate material" and a "planographic printing plate", respectively.

Hitherto, as planographic printing plates those plates called a deep-etch plate and a pre-sensitized (PS) plate have been most widely used.

A deep-etch plate is produced by the steps of coating a negative type light-sensitive resin on a sand grained aluminum or zinc plate, developing after printing a positive original thereon, rubbing in a tincture after or without etching, providing a lacquer thereon, and then peeling off the hardened light-sensitive resin layer.

On the other hand, PS plates mainly have a structure where a light-sensitive resin is coated on an aluminum plate. In the case of such a PS plate, an image is printed using a positive original (mask) or negative original (mask) and developed, and then a developing ink or protective lacquer is provided on the hardened light-sensitive resin layer constituting the image areas, whereby the printing plate is obtained. In this way, while the treatment steps required for the production of a PS plate are greatly simplified as compared with the deep-etch plate, steps such as development, etc., are still needed.

Recently, planographic printing plate materials in which treatment after exposure is omitted and which can be mounted on a printing machine and printed immediately after exposure without applying any chemical treatments have been proposed. In this specification, such a printing plate material is called a "non-treatment type" printing plate material in the sense that no treatment is applied as described above. The details of such a non-treatment type printing plate material are described in U.S. Pat. No. 3,707,372.

This non-treatment type planographic printing plate is produced from a radiation-sensitive member having a three layer structure in which a metallic first layer, a second layer of a material capable of forming a reaction product on reacting with the above first layer upon exposure to electromagnetic radiation, and a third layer of material unreactive with the above second layer are bonded to each other. In this case, an electromagnetic radiation image is projected onto the above second layer through the first or third layer, thus selectively forming the above reaction product, and thus the relationship of their hydrophilic nature to their oleophilic nature of the areas where the above reaction product is formed is different from that of the unreacted areas, whereby a planographic printing plate is obtained.

However, conventional non-treatment type planographic printing plate materials such as the above have an insufficient shelf life since an undesirable interaction between the first layer and the second layer of the material often occurs during storage. Moreover, since such conventional non-treatment type planographic printing plate materials after exposure have an insufficient difference in the relationship of their hydrophilic nature to their oleophilic nature, such materials cannot be employed as a printing plate for practical use.

SUMMARY OF THE INVENTION

Accordingly, an object of this invention is to provide a non-treatment type planographic printing plate material having an improved shelf life.

Another object of this invention is to provide a non-treatment type planographic printing plate material in which, upon application of electromagnetic radiation thereto, a large difference in the ratio of hydrophilicity to oleophilicity between the irradiated areas and the unirradiated areas arises so that excellent prints free from scumming can be obtained.

A further object of the invention is to provide a non-treatment type planographic printing plate material having an improved printing durability.

The above-described object of this invention can be attained by a non-treatment type planographic printing plate material comprising a support and light-sensitive layer provided on the support, the light-sensitive layer being composed of (A) an inorganic material, and (B) at least one metal and/or metal compound [which are capable of undergoing a mutual reaction upon application of electromagnetic radiation] and (C) an organic compound capable of affecting the above mutual reaction, which are in contact with each other, wherein the application of electromagnetic radiation causes a difference to occur in the hydrophilic or oleophilic nature between the irradiated areas and the unirradiated areas of the light-sensitive layer.

DETAILED DESCRIPTION OF THE INVENTION

Figure 1:
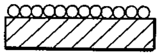
FIGS. 1 to 14 are schematic sectional views of planographic printing plate materials of this invention in which various structures are illustrated by showing various combinations of materials.

The non-treatment type planographic printing plate material of this invention greatly differs in various respects from prior art non-treatment type planographic printing plate materials as described in U.S. Pat. No. 3,707,372, and thus they are distinguishable from each other. That is to say, although they are both non-treatment type planographic printing plate materials, the prior art printing plate material has a radiation-sensitive member of a three layer structure, whereas in the printing plate material of this invention, at least one of the components of the light-sensitive layer is not in a layer form, but there is an area always in a state of a physical mixture. Moreover, in the prior art printing plate materials a metallic layer and an inorganic material layer capable of forming a reaction product are bonded, whereas in this invention, in addition to an inorganic material and a metal and/or metal compound which are reactive with each other, an organic compound capable of affecting this mutual reaction is present, whereby excellent printing properties are obtained. Thus, the printing plate material of this invention exhibits excellent capabilities.

Supports which can be used in this invention are those having a hydrophilic surface and suitable rigidity, and include those supports which have been used as supports for conventional planographic printing plates and also those supports which have the possibility of being so used. For instance, a metal plate, a plastic sheet whose surface has been subjected to a hydrophilization treatment, a sheet in which a metal plate or metal foil is laminated on a plastic sheet or paper, etc., can be used.

As the metal plates, an aluminum plate and a zinc plate are usually used, and also the so-called multilayer plate can be used. Where these metal plates are used, they are preferably sand grained so as to increase their water receptivity and also to increase adhesion between them and a light-sensitive layer provided thereon. As with conventional PS plates, etc., the surface may be, if necessary, treated chemically or electrochemically after the sand graining. Particularly in the case of an aluminum plate, the formation of an aluminum oxide layer on the sand grained surface by anodic oxidation has generally been conducted. Furthermore, it is possible to further increase suitability as a planographic printing plate by treating the surface with an acid or alkali.

As electrolytes for use in anodic oxidation of the aluminum plate, sulfuric acid, phosphoric acid, oxalic acid, and the like can be used. Moreover, the application of a porous chromium plating on the surface of the aluminum plate after the sand graining thereof has hitherto been conducted, and supports so obtained can be used.

Examples of plastic sheets whose surface has been subjected to hydrophilization include a cellulose triacetate sheet whose surface has been rendered hydrophilic by saponification, and those prepared by coating a hydrophilic layer on the surface of a plastic sheet such as a polyethylene terephthalate sheet or the like.

Even where a metal surface is used, all of the support does not always need to be made of metal, and a part of the support can be replaced with a plastic or paper. Thus, composite sheets in which a metal layer and a plastic sheet or paper are laminated together can be used.

In the non-treatment type planographic printing plate material of this invention, on such a support there is provided a light-sensitive layer comprising (A) an inorganic material; (B) at least one metal and/or a metal compound [(A)/(B) are mutually reactive with each other on application of electromagnetic radiation] and (C) an organic compound capable of affecting the above mutual reaction.

The "mutual reaction" which occurs between components (A) and (B) as discribed herein is a "photodoping" and is mutual diffusion phenomenon which occurs at the irradiated areas when the combination of a certain metal halides or chalcogen glass which corresponds to component (A) of this invention and a metal or a metal compound which corresponds to component (B) of the present invention is exposed to light, as disclosed in, for example, *Bulletin of the Chemical Society of Japan.* vol. 46 No. 4 pp. 1291–1295 (1973); *Photographic Science and Engineering.* vol. 15 No. 3 pp. 175–180 (1971); and Japanese Patent Application (OPI) No. 10018/74.

The mechanism of this phenomenon can be explained as follows, that is, when metals are used as component (B), the mechanism is considered to comprise a first step where positive hole-electron pairs are generated in component (A) due to the exposure to light and the positive holes formed move toward component (B) i.e., the metal, a second step where the positive holes upon reaching the metal oxidize the metal atoms to positive metal ions, and a third step where the electrons trapped in component (A) and the thus-formed metal ions are attracted to each other by Coulombic forces thereby to mutually diffuse; and when metal compounds are used as component (B), the mechanism is considered that just after positive hole-electron pairs are generated in component (A) upon exposure to light, metal ions of component (B) i.e., metal compound are diffused into component (A) due to negative space-charge formed by the electrons trapped in component (A), on the other hand, the positive holes in component (A) combine with the negative ions remaining in component (B).

Accordingly, in the present invention, components (A) and (B) are so selected that a combination is chosen capable of causing the photodoping reaction as disclosed above to occur.

In considering the materials used in the present invention, reference will be made to various groupings of the Periodic Table of the elements, the Periodic Table employed being that from *Rikagaku Jiten,* pages 1484–1485, third edition published by Iwanami Shoten (1973).

For the inprganic materials of component (A) of the present invention, materials having properties (hole-donating) of generating positive hole-electron pairs and forming positive holes more mobile in the material than electrons can be used. The following materials are preferably used as these inorganic materials (1) Sulfure group elements, i.e., S, Se and Te and mixtures thereof (2) Chalcogenide compositions represented by M-Sulfur Group Element. M-Sulfur Group Element-X and M-Sulfur Group Element-X-Y in which M represents an atom of Group Ib, IIb, IIIb, IVa, IVb, Vb, VIa or VIII of the Periodic Table, and preferably an atom of Group Ib, IVa, IVb, Vb or VIII such as Cu, Ag, Ti, Ge, Sn, Pb, Si, As, Sb, Bi or Fe, particularly preferably Ge, Sn, Pb, Si, Ag, Ti or Fe; X and Y, which are not the same as M, represent individually an atom selected from the group consisting of Al, Sb, Si, Mg, Ti, V, Mn, Co, Ni, Ta, Mo, W, Sn, Zn, Pb, Bi, Ag, Pd, In, O, P, Cl, Br and I, preferably Bi, Zn, P, Sb, Sn, Pb, Ag, Si, O or Mn; the sulfur group element of the above formulae represents at least one element selected from the group consisting of S, Se and Te: and in which the amount of the sulfur group element present in each formula is more than that of the sulfur group element stoichiometrically corresponding to the lowest valency (other than a valency of zero) which an atom represented by M can have. That is, in the above formulae:

(i) Chalcogenide compositions represented by M-sulfur Group Element which satisfy the relationship $2n/km > 1$ when the quantitative relationship between each element contained therein is considered to be $(M)_m^k$(Sulfur Group Element)$_n$ [wherein k is the lowest valency which M can have, other than 0, m is the number of M and n] is the number of the Sulfur Group Element;

(ii) Chalcogenide compositions represented by M-Sulfur Group Element-X which satisfy the following relationship.

$$\frac{2n - hl}{km} > 1 \text{ (when } X \text{ is an atom which can be a positive ion) and}$$
$$\frac{2n}{km - hl} > 1 \text{ (when } X \text{ is an atom which can be a negative ion)}$$

when the quantitative relationship between each element present therein is considered to be $(M)_m{}^k$ (Sulfur Group Element)$_n(X)_l{}^h$ [wherein k, m and n each has the same meanings as defined above, h is the lowest valency which X can have, other than 0, and l is the number of X] and when X is an element which folls in the category defined as M, M in the above formula represents the element of the two elements, which is present in larger amount; and (iii) Chalcogenide compositions represented by M-Sulfur Group Element-X-Y which satisfy the following relationship;

$$\frac{2n - (hl + jp)}{km} > 1 \text{ (when both } X \text{ and } Y \text{ are atoms which can be positive ions)}$$
$$\frac{2n - hl}{km - jp} > 1 \text{ (when } X \text{ is an atom which can be positive ion, and } Y \text{ is an atom which can be a negative ion), and}$$
$$\left.\begin{array}{l} km - (hl + jp) \leqq 0 \\ \text{or} \\ \dfrac{2n}{km - (hl + jp)} > 1 \text{ [when } km - (hl + jp) > 0] \end{array}\right\} \text{(when both } X \text{ and } Y \text{ are atoms which can be negative ions)}$$

when the quantitative relationship between each element present therein is considered to be $(M)_m{}^k$ (*Sulfur Group Element*)$_n(X)_l{}^h(Y)_p{}^j$ [wherein k, m, n, h, l, each has the same meanings as defined above, j is the lowest valency which Y can have, other than 0, and p is the number of Y] and when X and/or Y are elements which fall in the category defined as M, M in the above formula represents the element of the two or three elements, which is present in largest amount; can be used. In the chalcogenide composition of M-Sulfur Group element-X, a content of X is preferably not more than 30 atomic % based on the composition. Further, in the chalocogenide composition of M-Suflur Group Element-X-Y, the total amount of X and Y is preferably not more than 30 atomic % based on the total composition. Examples of suitable chalcogenide compositions are As-S, As-Se, As-Te, Ge-S, Bi-S, Sb-Te, As-S-Te, As-S-Se, Ge-S-Bi, Ge-S-Bi-Si, etc.

(3) Halides of an atom of Group IVb of the Periodic Table in which the amount of halogen atom present therein is more than that of the halogen atom stoichiometrically corresponding to the lowest valency (other than a valency of 0) which the atom of Group IVb can have, that is, those represented by $PbX_{1+x}$, $SnX_{2+x}$ or $GeX_{2+x}$ (wherein X represents a halogen atom, preferably an iodine atom and x is a positive number i.e., $x>0$). Examples of suitable halides are $PbI_2$, $SnI_4$, $GeI_4$, etc.

Of these inorganic materials, those compositions containing germanium and sulfur are especially suitably used in this invention. This is because germanium and sulfur-containing compositions have less toxicity and cause less pollution, and, furthermore, it is comparatively easy to control hydrophilic and oleophilic properties. A germanium and sulfur-containing composition is produced by weighing, as starting materials, germanium and sulfur, and as necessary, other elements or compounds in such amounts as to provide the predetermined atomic ratio, charging them to silica capsule under a reduced presssure on the order of $10^{-5}$ Torr, melting by heating, rendering the molten solution uniform by holding it for a long period of time and rapidly quenching the silica capsule in water or cooling it in a room at ambient conditions. Of course, as the starting materails, in place of germanium and sulfur elements, a compound containing both of them, i.e., germanium sulfide, can be used.

Suitable exmaples of compositions containing germanium and sulfur which can be used in this invention are shown below.

Ge-S based:

$GeS_{1.5}$, $Ge_{35}S_{65}$, $GeS_2$, $GeS_4$, $Ge_{15}S_{85}$

Ge-S-X based:

$Ge_{35}S_{60}Al_5$(amorphous), $Ge_{35}S_{60}P_5$(amorphous), $Ge_{35}S_{60}Sb_5$(amorphous), $Ge_{35}S_{60}Si_5$(amorphous), $Ge_{35}S_{60}Mg_5$(amourphous+crystalline), $Ge_{35}S_{60}Ti_5$(amorphous+$GeS_2$+$TiS_2$), $Ge_{35}S_{60}V_5$(amorphous+$GeS_2$+ $V_2S_3$), $Ge_{35}S_{60}Mn_5$ (amorphous+$Mn_2GeS_4$), $Ge_{35}S_{60}Co_5$ (amorphous+ $GeS_2$), $Ge_{35}S_{60}Ni_5$ (amorphous+$GeS_2$), $Ge_{35}S_{60}Ta_5$ (amorphous+$TaS_2$), $Ge_{35}S_{60}Mo_5$ (amorphous+$MoS_2$), $Ge_{35}S_{60}W_5$(amourphous+$WS_2$+crystalline), $Ge_{35}S_{60}Sn_5$ (amouphous+$\beta$-$SnS_2$ or $\alpha$-$Sn_{1+x}S_2$), $Ge_{35}S_{60}Zn_5$ (amorphous+ZnS), $Ge_{35}S_{60}Pb_5$(amorphous+$GeS_2$), $Ge_{25}S_{70}Bi_5$ (amorphous), $Ge_{20}S_{70}Bi_{10}$(amorphous), $Ge_{10}S_{80}Bi_{10}$(amorphous), $Ge_{10}S_{70}Bi_{20}$(amorphous) $Ge_{20}S_{80}Bi_{10}$ (amorphous), $Ge_{40}S_{60}Bi_1$ (amorphous), $Ge_5S_{80}Bi_{15}$(amorphous), $Ge_{35}S_{60}Bi_{10}$(amorphous+Bi), $Ge_{35}S_{60}Bi_{15}$ (amourphous+Bi), $Ge_{40}S_{60}Bi_5$(amorphous+Bi), $Ge_{40}S_{60}Bi_{10}$ (amorphous+Bi), $Ge_{35}S_{60}Bi_2$ (amorphous+Bi), $Ge_{38.46}S_{61.54}Bi_5$ (amorphous+Bi), $Ge_{37.74}S_{62.26}Bi_5$ (amorphous+Bi), $Ge_{31.3}S_{68.7}Bi_5$ (amorphous+$GeS_2$), $Ge_{20}S_{60}Bi_{20}$ (amorphous+$GeS_2$), $Ge_{10}S_{60}Bi_{30}$ (amorphous+$Bi_2S_3$), $Ge_{35}S_{60}Bi_5$ (amorphous+Bi+$GeS_2$+GeS), $Ge_{35}S_{65}Bi_5$ (amorphous +Bi+$GeS_2$+GeS), $Ge_{33.3}S_{66.7}Bi_{15}$ (amorphous+Bi+$GeS_2$+GeS), $Ge_{20}S_{80}O_{0.2}$, $Ge_{20}S_{80}O_{20}$, $Ge_{42}S_{58}Ag_{0.1}$, $Ge_{42}S_{58}Ag_2$, $Ge_{36}S_{55}I_9$, $Ge_{35}S_{60}Al_{15}$, $Ge_{20}S_{75}Al_5$, $Ge_{30}S_{60}P_{10}$, $Ge_{30}S_{60}Sb_{10}$, etc.

Ge-S-X-Y based:

$Ge_{25}Si_{10}S_{60}Bi_5$ (amorphous+Bi), $Ge_{30}Si_5S_{60}Bi_5$ (amorphous+Bi+$GeS_2$), $Ge_{20}Si_{15}S_{60}Bi_5$ (amorphous+Bi+$SiS_2$), $Ge_{15}Si_{20}S_{60}Bi_5$ (amorphous+Bi+$SiS_2$), $Ge_{10}Si_{25}S_{60}Bi_5$ (amorphous+Bi+$SiS_2$+$Bi_2S_3$+$GeS_2$), $Ge_{33}S_{57}Bi_5Ag_5$ (amorphous+Bi), $Ge_{30}S_{60}Bi_5Ag_5$ (amorphous+Bi+$GeS_2$+GeS), $Ge_{34}S_{59}Bi_5Ag_2$ (amorphous+Bi+$GeS_2$+GeS), $Ge_{33}S_{57}Bi_5O_5$ (amorphous+Bi), $Ge_{20}S_{80}P_1O_2$, $Ge_{20}S_{80}P_{10}O_{20}$, $Ge_{20}S_{60}Sb_5P_5$, $Ge_{15}S_{70}Sb_{7.5}P_{7.5}$, $Ge_{10}S_{80}P_{10}Pb_{0.5}$, $Ge_{10}S_{80}P_{10}Pd_5$, $Ge_{10}S_{80}P_{10}Bi_{10}$, $Ge_{35}S_{60}P_5Bi_5$, $Ge_{35}S_{60}Bi_5I_5$, etc.

The figures showing the composition ratio of the above compositions inducate the atomic ratio of the starting materials, and since some of the above compositions are not normalized, the total of the figures sometimes exceeds 100. The compositions containing oxygen are prepared by melting oxides as starting meterials. The descriptions in parentheses indicate qualitatively the results obtained by X-ray analysis of the compositions obtained, and some of them are amorphous and others are partially or completely crystallized and the use of such compositions enables one to obtain the printing plate of this invention.

The composition ratio of the germanium and sufur-containing compositions is in the range of $1.5 \leqq S/Ge < 16$, preferably $1.7 \leqq S/Ge < 9$.

The metal employed as one of component (B) in this invention is a metal element selected from the group consisting of Ag, Cu, Ge, Zn, Cd, Au, Pb, Al, Ga, In, Sn, V, Se, Cr, Fe, Tl, Bi, Mg, Mn, Co, Ni, Sb, Te, and Pd, where Se and Te as the metal of component (B) is used when the inorganic material (A) is a chalcogenide composition or a halide. Preferred examples of the above metal are Ag and Cu.

The metal compound employed as one of component (B) in this invention is a compound selected from the group consisting of (1) a sulfide of a metal of Group Ib, IIb, IVb, Vb, or VIII, preferably Group Ib, IVb or VIII, of the Periodic table, such as $Ag_2S$, $Cu_2S$, PbS or FeS; and (2) a halide of a metal of Group Ib, IVb, or VIb, preferably Group Ib or IVb, of the Periodic Table such as AgCl, AgBr, AgI, CuCl, $CuCl_2CuBr$, $CuBr_2$, PbCl or $PbCl_2$ (these halides are used when the inorganic materail (A) is a sulfur group element or a chalocogenide composition); those which are not the same as the inorganic material (A) used therewith.

As component (B) of this invention, metals as described are preferred as compared with metal compounds as described above since metals provide higher sensitivity in photodoping.

As (C) organic compounds of this invention, organic compounds used in the field of silver halide emulsion photographic chemistry are suitable, such as anti-foggants, desensitizers, sensitizing dyes and the like. Furthermore, organic photochromic materails can be used. Component (C) of this invention is not a component used as a binder.

Examples of suitable organic compounds are shown below.

I. Benzotriazole

II. Alkylene oxide polymers (1) $HO(R\text{-}O)_nH$ (R=ethylene, propylene, butylene; n=10 to 10,000);

III. Carboxylic acids (1) Lower unsaturated carboxylic acids e.g., maleic acid, fumaric acid, cinnamic acid;

e.g., maleic acid, fumaric acid, cinnamic acid;

(2) EDTA (i.e., ethylenediaminetetraacetic acid)

IV Phenols (1) Phenol and its derivatives

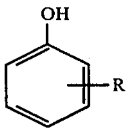

(R=H, methyl, ethyl, COOR' (R'=methyl, ethyl))

e.g., phenol, methyl-p-hydroxybenzoate;

(2) Polyhydric phenols

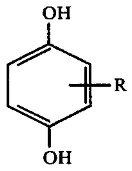

(R=H, an alkyl group having 1 to 18 carbon atoms)

e.g., hydroquinone, methylhydroquinone, propylhydroquinone, 2,5-di(1,1-dimethylbutyl)-hydroquinone;

V Amines and hydrazines (1) Aliphatic amines $NH_2(RNH)_nRNH_2$ (R=an alkylene chain having 1 to 6 carbon atoms; n=1-3)

e.g., 3-azatetramethylenediamine;

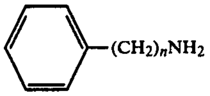

(n=1 to 20)

e.g., β-phenylethylamine, γ-phenylpropylamine;

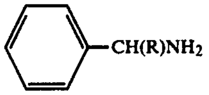

(R=an alkyl group having 1 to 5 carbon atoms)

e.g., 1-phenylpropylamine, 1-phenylbutylamine;

(2) Aromatic amines, e.g., those compounds containing two or more amino groups on one benzene ring, for example, benzidine, chloramine, Metol;

(3) Hydrazine

VI Those compounds containing a —CO—NH group e.g., phthalimide, saccharin, salicylamide, acetylated compounds of aminophenol;

VII Sulfur containing organic compounds

Organic compounds having at least one of an —SH group, a

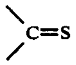 group, an $-(S)_n$-group wherein n=1 to 6, an $-SO_2H$ group or an $-SO_3H$ group, can be used in this invention.

(1) Thiourea represented by the following formula:

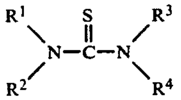

($R^1$-$R^4$=H, an alkyl group or hydroxyalkyl group having 1 to 5 carbon atoms, a phenyl group; wherein $R^1$ and $R^2$ or $R^3$ and $R^4$ may be bonded to form a 5-membered heterocyclic ring such as pyrrolidine)

e.g., thiourea, ethylenethiourea, trimethylthiourea, N,N'-dimethylolthiourea;

(2) Thiosemicarbazide and thiocarbazide represented by the following formulae:

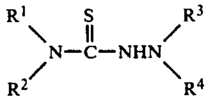

-continued

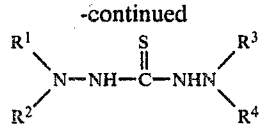

($R^1$-$R^4$=H, an alkyl group having 1 to 5 carbon atoms, a phenyl group) and derivatives thereof, e.g., thiosemicarbazide, 4-phenylthiosemicarbazide, dithizone, thiocarbazide;

(3) Sulfide or polysulfides represented by the following formula:

$R^1$—$(S)_n$—$R^2$ ($R^1$, $R^2$=an alkyl group having 1 to 30 carbon atoms, a phenyl group, a naphthyl group; wherein such groups may be substituted with a carboxyl group, a nitro group, an —$NH_2$ group, a formylalkylamino group having 1 to 3 carbon atoms, etc.; n=1 to 6)

e.g., 4,4'-thiodibenzoic acid, diformylmethyldisulfide;

(4) Sulfinic acid or sulfonic acid represented by the following formulae:

R—$SO_2H$

R—$SO_3H$ (R=an alkyl group having 1 to 5 carbon atoms, a phenyl group)

e.g., benzenesulfinic acid, benzenesulfonic acid, 2-butanesulfinic acid;

(5) Dithiocarbamic acid represented by the following formula:

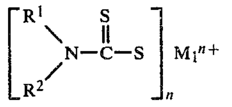

($R^1$, $R^2$=H, an alkyl group having 1 to 5 carbon atoms, an aralkyl group having 7 to 9 carbon atoms, a phenyl group; $M_1$=H, an n valent metal ion; n=1 to 2)

e.g., sodium diethyl dithiocarbamate, silver diethyl dithiocarbamate, zinc dibenzyl dithiocarbamate;

(6) Thiobenzophenone represented by the following formula:

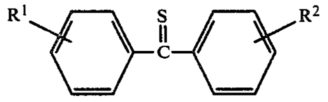

(R', $R^2$=H, an alkyl group having 1 to 5 carbon atoms, an alkoxy group having 1 to 5 carbon atoms, an amino group substituted with two alkyl groups which may each have 1 to 5 carbon atoms, Cl, Br, I)

e.g., N,N,N',N'-tetramethyl-4,4'-diaminothiobenzophenone (thio Michler's ketone);

(7) A 5-membered ring or a derivative thereof having a sulfur atom as one member of the ring;

(a) Dithiolan (b) Thiazole or benzothiazole; which can be substituted with an alkyl group having 1 to 5 carbon atoms, an acetylthioacetamido group, an —$NH_2$ group and/or an —SH group, if desired;

e.g., 1,3-thiazole, benzothiazole, 2-aminobenzothiazole, 2-[α-(acetylthio)acetamido]benzothiazole, 2-mercaptobenzothiazole, 2-mercapto-6-methylbenzothiazole;

(c) Thiazoline, rhodanine, isorhodanine;

(d) Thiazolidine, 4-carboxy-thiazolidine;

(e) Thiadiazole, 2,5-dimercapto-1,3,4-thiadiazole, potassium-5-sulfido-2-thioxo-1,3,4-thiadiazoline;

These sulfur containing 5-membered ring compounds may be unsubstituted or substituted. Of these, mercapto or thioether-substituted ones are particularly preferred.

(8) The following compounds substituted with an —SH group, an =S group or an —S—R group wherein R represents an alkyl or alkenyl group having up to 20 carbon atoms, a phenyl group and the like;

(a) Pyrrole and benzopyrrole; which can be substituted with an alkyl group having 1 to 20 carbon atoms, a phenyl group, and/or an alkylcarbonyl group having 2 to 5 carbon atoms, if desired;

e.g., 2-mercaptopyrrole, N-mercapto-2-acetyl-benzopyrrole;

(b) Imidazole and benzimidazole; which can be substituted with an alkyl group having 1 to 20 carbon atoms, an alkylamido group having 2 to 21 carbon atoms, and/or a phenyl group, if desired;

e.g., 2-mercaptoimidazole, 2-mercaptobenzimidazole, 5-lauroamido-2-mercaptobenzimidazole, 2-undecyl-3-phenyl-4-mercaptoimidazole, 1-phenyl-2-mercaptoimidazole;

(c) Imidazoline e.g., 2-mercaptoimidazoline, 2-hexyldecylthioimidazoline hydrogen bromide salt;

(d) Pyrazole and pyrazolidine; which can be substituted with one or more carboxyl groups and/or benzoyl groups, if desired;

e.g., 1-mercaptopyrazole, 1-mercaptopyrazole-3,5-dicarboxylic acid, 1-benzoyl-3-mercaptopyrazolidine, 1,2-benzoylpyrazolidine-3-thione;

(e) Triazole and benztriazole; which can be substituted with one or two alkyl groups having 1 to 20 carbon atoms, a phenyl group and/or a phenyl group substituted with an alkylamido group having 2 to 20 carbon atoms, if desired;

e.g., 2-mercapto-1,2,4-triazole, N-mercaptobenzotriazole, 3,4-dimethyl-5-mercapto-1,2,4-triazole, 3-methyl-4-phenyl-5-mercaptotriazole, 3-mercapto-4-phenyl-1,2,4-triazole, 3-p-caproamidophenyl-4-ethyl-5-mercapto-1,2,4-triazole, 3-n-undecyl-4-phenyl-5-mercapto-1,2,4-triazole;

Moreover, 1,5-dimercapto-3,7-diphenyl-[1,2,4]triazolo-[1,2,a][1,2,4]triazole can be used.

(f) Tetrazole; which can be substituted with one or two alkyl groups having 1 to 5 carbon atoms, a phenyl group, a phenyl group substituted with a benzamide group and/or an alkylamide group having 2 to 21 carbon atoms, if desired;

e.g., 5-mercaptotetrazole, 1-phenyl-5-mercaptotetrazole, 1-(m-caproamidophenyl)-5-mercaptotetrazole, 1-(m-lauroamidophenyl)-5-mercaptotetrazole, 1-(m-benzamidophenyl)-5-mercaptotetrazole;

(g) Oxazole and benzoxazole; which can be substituted with one or two alkyl groups having 1 to 5 carbon atoms, or phenyl groups, if desired;

e.g., 2-mercaptobenzoxazole;

(h) Pyridine; which can be substituted with one or two carboxyl groups, or sulfo groups;

e.g., N-mercaptopyridine-2,3-dicarboxylic acid, N-mercaptopyridine-2-sulfonic acid;

(i) Quinoline, isoquinoline and 5,8-dioxyquinoline; which can be substituted with one or two carboxyl groups, if desired;

e.g., 2-mercaptoquinoline, 2-mercaptoisoquinoline, 3-mercaptoquinoline-2,3-dicarboxylic acid, 2-mercapto-5,8-dioxyquinoline;

(j) Pyrimidine; which can be substituted with one or more alkyl groups having 1 to 5 carbon atoms, or an oxo group, if desired;

e.g., 2-mercaptopyrimidine, 2-mercapto-4-methyl-6-oxopyrimidine, thiobarbituric acid, 2-ethylthio-4-methyl-6-oxopyrimidine;

(k) Morpholine; which can be substituted with a benzoyl group, if desired;

e.g., 2-mercaptomorpholine, 2-mercapto-N-benzoylmorpholine;

(l) Purine and caffeine;

e.g., 2-mercaptopurine, 2-mercaptocaffeine;

(m) Tetrazaindene; which can be substituted with an alkyl group having 1 to 3 carbon atoms or a hydroxyl group;

e.g., 2-mercapto-4-hydroxy-6-methyl-1,3,3a,7-tetrazaindene;

Compounds (a) to (m) above without substituents such as an —SH group, an =S group, an —S—R group wherein R has the same meaning as above can still be used as the organic compound of the present invention.

VIII Selenic acids

R—$SeO_2H$ (R=an alkyl group having 1 to 5 carbon atoms, or a phenyl group)

e.g., ethylselenic acid, benzeneselenic acid;

IX Effective dyes (The CI number indicates the identification number in the *Color Index*, 3rd Ed., The Society of Dyers and Colorists, Bradford, Yorkshire (1971).)

(1) Azo dyes (those containing an —N=N—group)

(a) Acid dyes;

e.g.,

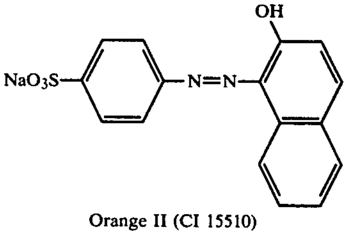

Orange II (CI 15510)

(b) Acid mordant dyes;

e.g.,

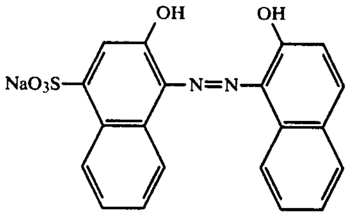

-continued

Chromium Blue Black RC (CI 15705)

(c) Direct dyes;

e.g.,

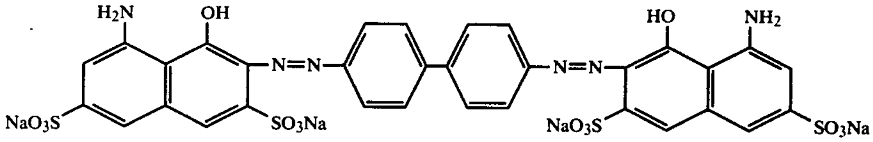

Direct Blue BB (CI 22610)

(d) Metal complex salt dyes;

e.g.,

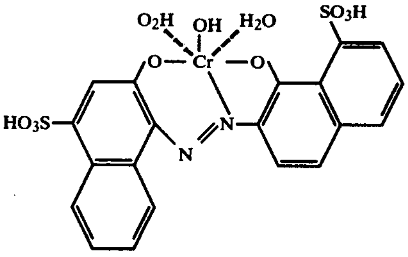

Palatine Fast Blue GGN (CI 14880)

(e) Basic dyes;

e.g.,

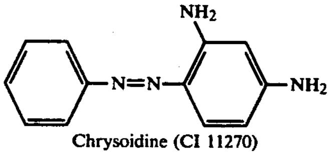

Chrysoidine (CI 11270)

(f) Acetate dyes;

e.g.,

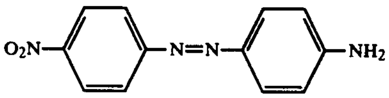

(g) Azoic dyes;

(i) Fast color bases;

e.g.,

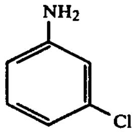

Fast Orange G Base (CI 37005)

(ii) Fast color salt;

e.g.,

-continued
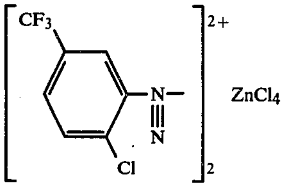
Fast Orange Salt RD (CI 37050)
(iii) Naphthols;
e.g.,
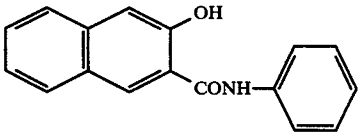
Naphthol AS (CI 37505)
(iv) Rapid fast dye;
e.g.,
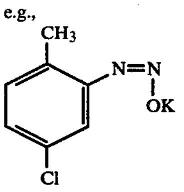
+
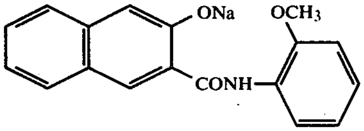
Rapid Fast Scarlet RH (CI 469)
(v) Rapidogen dye;
e.g.,
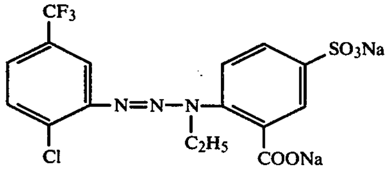
+
-continued
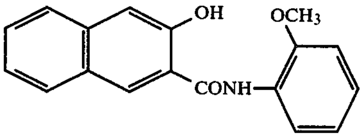
(h) Pyrazolone dyes
(those containing 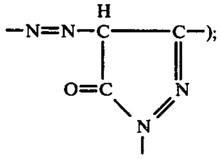
e.g.,
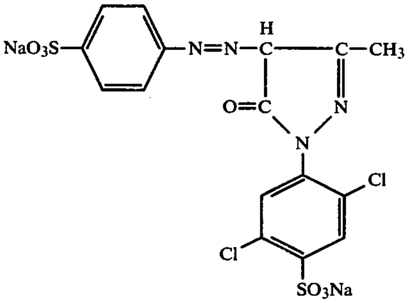
Xylene Fast Yellow 2 G (CI 18965)
(i) Stilbene dyes (those containing
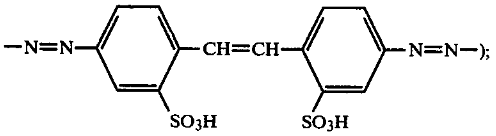
e.g.,
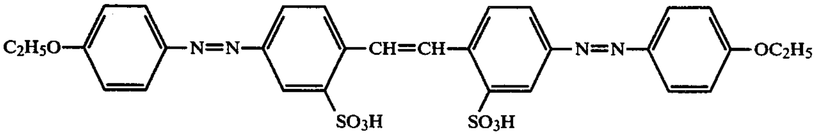
Chrysophenine G (CI 24895)
(j) Thiazole dyes
(those containing 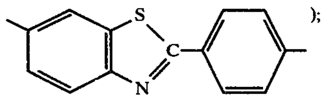 );
e.g.,
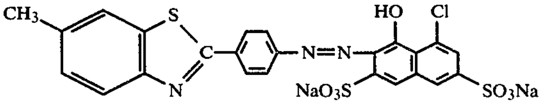
Diaminrosa BD (CI 15075)
(2) Anthraquinone dyes (those containing 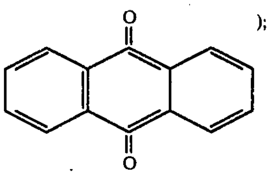);

(a) Mordant dyes;

e.g.,

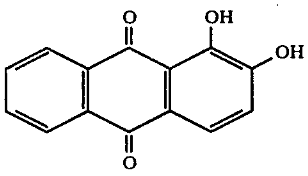

Alizarin (CI 58000)

(b) Acid Mordant dyes;

e.g.,

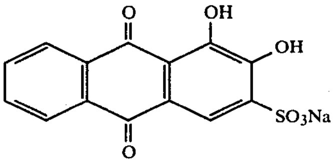

Alizarin Red S (CI 58005)

(c) Acid dyes;

e.g.,

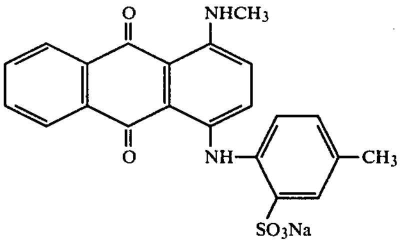

Alizarin Astral B (CI 61530)

(d) Acetate dyes;

e.g.,

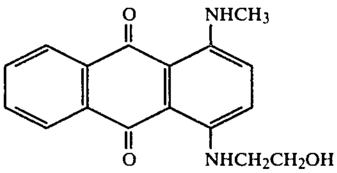

Celliton Fast Blue FER (CI 61505)

(e) Vat dyeing dyes
(i) Anthraquinone type;

e.g.,

-continued

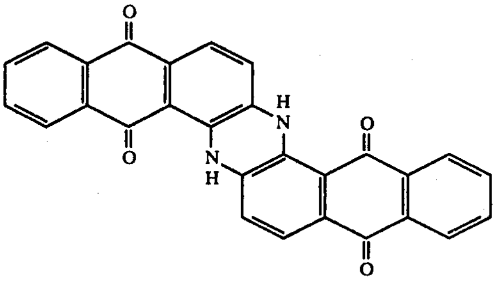

Indanthrene Blue RSN (CI 69800)

(ii) Anthrone type dyes;

e.g.,

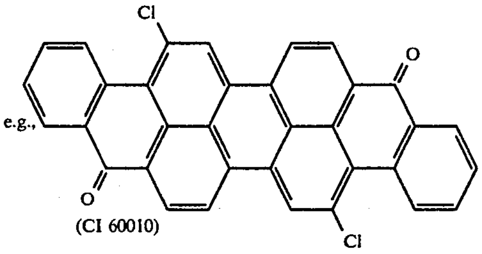

(CI 60010)

(3) Indigoid dyes (those containing —CO—C=C—CO—);

(a) Indigoids;

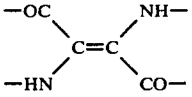

for example,

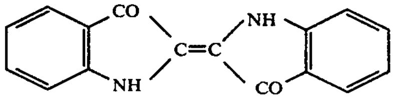

Indigo (CI 73000)

(b) Thioindigoids;

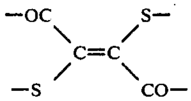

for example,

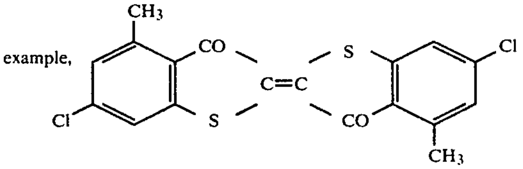

(CI 73385)

(4) Soluble vat dyeing dyes
(a) Indigoid;

e.g.,

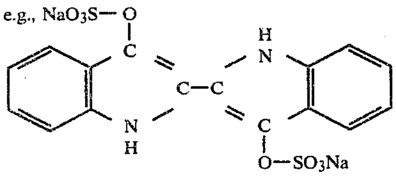

Indigodol O (CI 73002)

(b) Anthraquinoid;

e.g.,

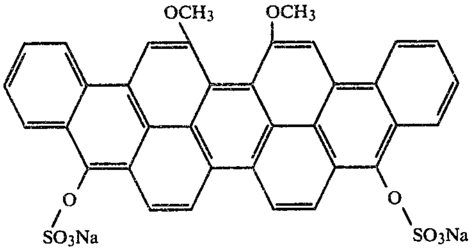

Anthrasol Green IB (CI 59826)

(5) Sulfur dyes;

e.g.,

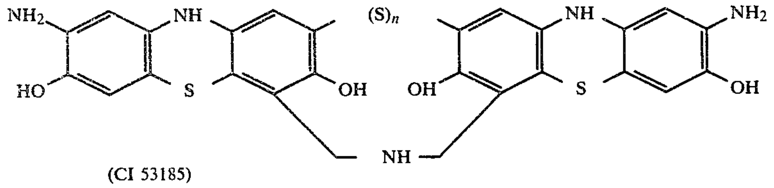

(CI 53185)

(6) Carbonium dyes (those containing $-\underset{\|}{C}-$);

(a) Diphenylmethane dyes (those containing 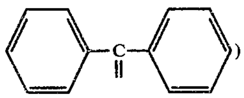 ) e.g.,

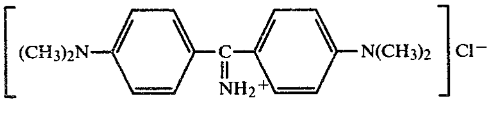

Auramine (b) Triphenylmethane dyes (those containing 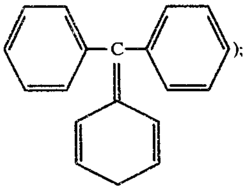); e.g.,

-continued

1.

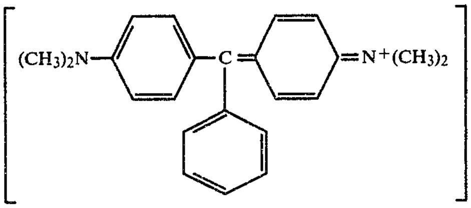

Oxalic acid salt
Malachite Green (CI 42000)

2.

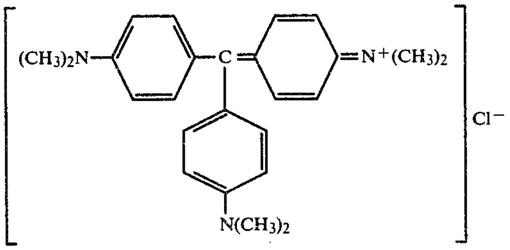

Crystal Violet (CI 42555)

(c) Xanthene dyes (those containing 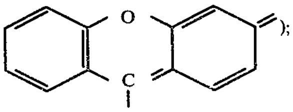); e.g.,

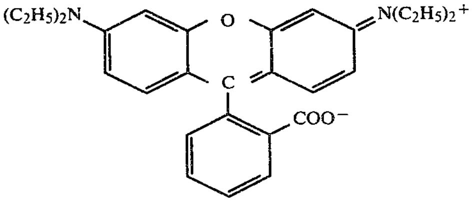

Rhodamine B (CI 45170)

(d) Acridine dyes (those containing 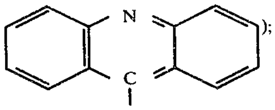); e.g.,

-continued

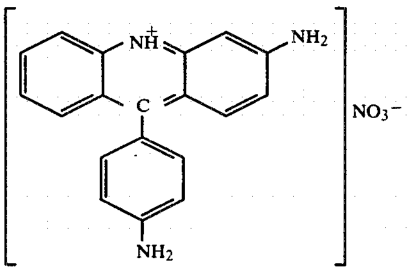

Phosphine (CI 46045)

(7) Quinoneimine dyes (those containing 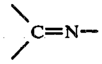 group)

(a) Azine dyes (those containing 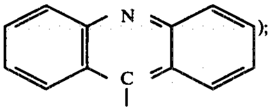); e.g.,

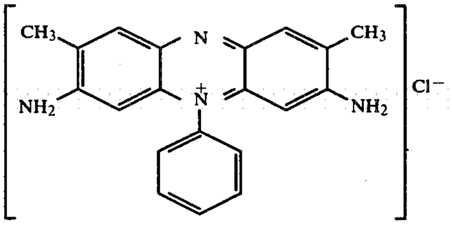

Safranine T (CI 50240)

(b) Oxazine dyes (those containing 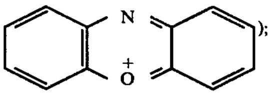); e.g.,

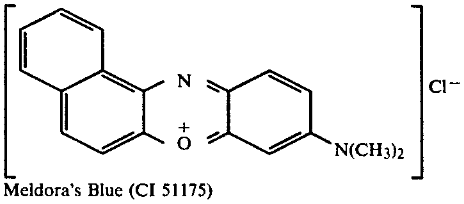

Meldora's Blue (CI 51175)

(c) Thiazine dyes (those containing 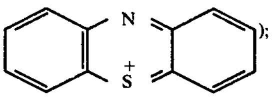); e.g.,

-continued

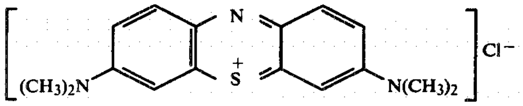

(CI 52015)

(8) Phthalocyanine dyes

Those containing

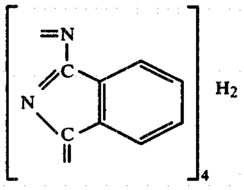

(9) Other dyes (a) Cyanine dyes (those containing 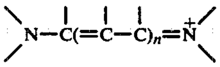);

(b) Quinoline dyes;

e.g., 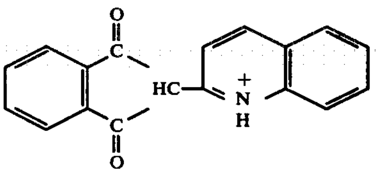

Quinoline Yellow (CI 47000)

(c) Nitro dyes;

e.g., 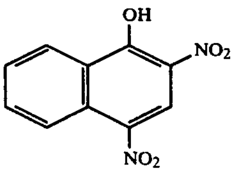

Naphthol Yellow S (d) Nitroso dyes;

e.g., 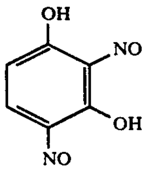

Fast Green O

X Spiropyran compounds (1)

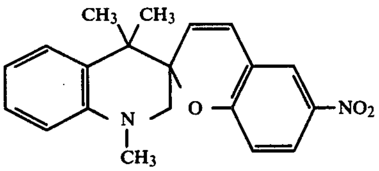

1,3,3-trimethyl-6′-nitro-spiro(indoline-2,2′-benzo-α-pyran)

(2)

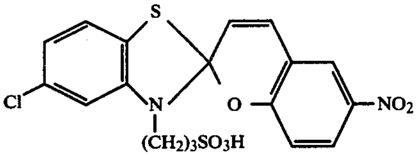

3-(3-sulfopropyl)-5-chloro-6′-nitrospiro(benzothiazoline-2,2′-benzo-α-pyran)

(3)

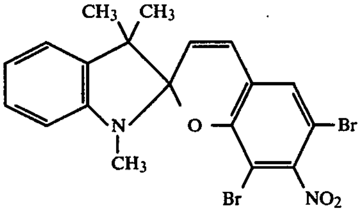

1,3,3-trimethyl-6′,8′-dibromo-7′-nitrospiro(indoline-2,2′-benzo-α-pyran)

(4)

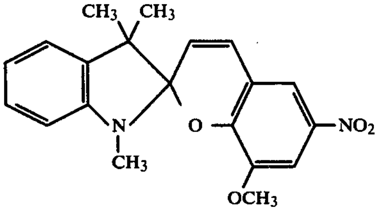

1,3,3-trimethyl-6′-nitro-8′-methoxyspiro(indoline-2,2′-benzo-α-pyran)

(5)

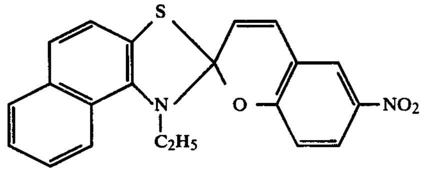

3-ethyl-6′-nitrospiro(benzothiazoline-2,2′-benzo-α-pyran)

(6)

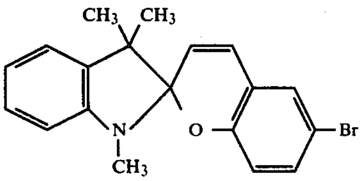

1,3,3-trimethyl-6′-bromospiro(indoline-2,2′-benzo-α-pyran)

(7)

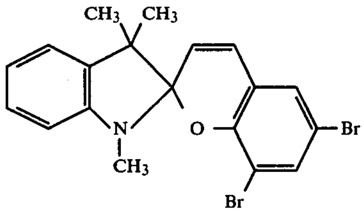

1,3,3-trimethyl-6′,8′-dibromospiro(indoline-2,2′-benzo-α-pyran)

(8)

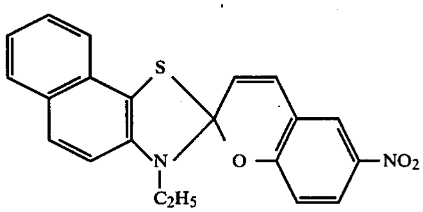

3-ethyl-6′-nitrospiro(naphtho[2,1,d]thiazoline-2,2′-benzo-α-pyran)

(9)

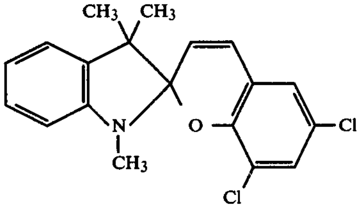

1,3,3-trimethyl-6′,8′-dichlorospiro(indoline-2,2′-benzo-α-pyran)

(10)

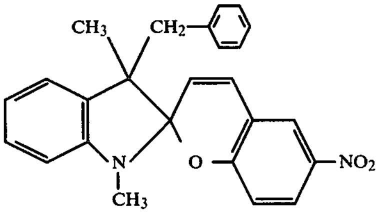

1,3-dimethyl-3-benzyl-6′-nitrospiro(indoline-2,2′-benzo-α-pyran)

(11)

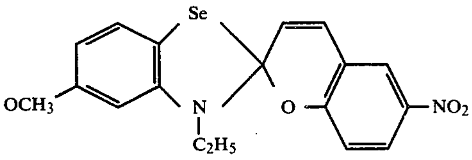

3-ethyl-5-methoxy-6′-nitrospiro(benzoselenazoline-2,2′-benzo-α-pyran)

(12)

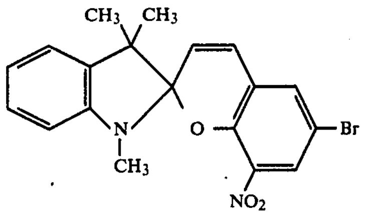

1,3,3-trimethyl-6'-bromo-8'-nitrospiro(indoline-2,2'-benzo-α-pyran)

(13)

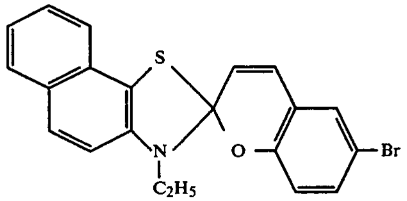

3-ethyl-6'-bromospiro(naphtho[2,1,d]thiazoline-2,2'-benzo-α-pyran)

(14)

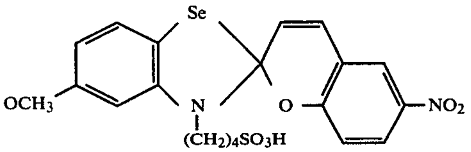

3-(4-sulfobutyl)-5-methoxy-6'-nitrospiro(benzoselenazoline-2,2'-benzo-α-pyran)

(15)

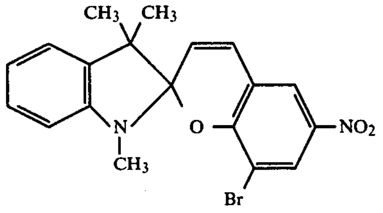

1,3,3-trimethyl-6'-nitro-8'-bromospiro(indoline-2,2'-benzo-α-pyran)

(16)

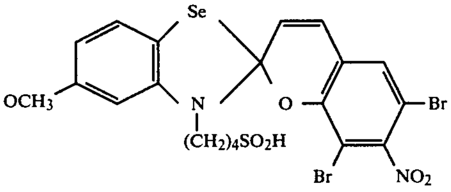

3-(4-sulfobutyl)-5-methoxy-6',8'-dibromo-7'-nitrospiro(benzoselenazoline-2,2'-benzo-α-pyran)

(17)

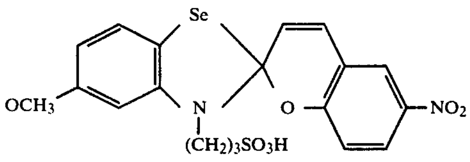

3-(3-sulfopropyl)-5-methoxy-6'-nitrospiro(benzoselenazoline-2,2'-benzo-α-pyran)

(18)

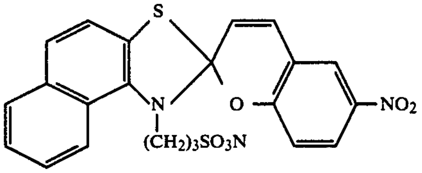

3-(3-sulfopropyl)-6'-nitrospiro(naphtho[1,2,d]thiazoline-2,2-benzo-α-pyran)

(19)

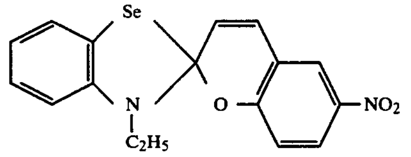

3-ethyl-6'-nitrospiro(benzoselenazoline-2,2'-benzo-α-pyran)

Of the organic compounds described above, benzotriazole I, sulfur containing organic compounds VII, dyes IX and spiropyran compounds X are preferred. In particular, benzotriazole I, sulfur containing organic compounds VII having an —SH group, a C═S group, more particularly, compounds (1), (2), (5), (6), (7)(a) (7)(b), (7)(c), (7)(d), (7)(e), (8)(b), (8)(c), (8)(e), (8)(f), (8)(j), and (8)(m) of VII and Methylene Blue, Crystal Violet and Rhodamine B of VIII are preferably employed.

Hereinabove the materials usable in this invention have been illustrated in detail, and hereinbelow the layer structures of this invention, in which the above materials are used, will be explained.

In accordance with the present invention, (A) the inorganic material, (B) the metal and/or metal compound and (C) the organic compound are provided on the support such that these components are in contact with each other. Therefore, one cannot provide these components as each layer thereof on the support. It is required that at least one of the components not be in a layer form, that is, such must be in the form of discontinuous island-like particles (diameter of about 30 Å to about 0.5 micron) on the support or on the other components fixed on the support as illustrated in the Figures.

Figure 2:
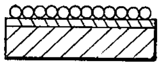
Figure 3:
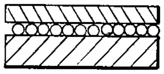

FIGS. 1 through 3 illustrate non-treatment type planographic printing plates of this invention in which the light-sensitive layer is formed using an inorganic material, a metal and/or metal compound, and an organic compound.

FIG. 1 illustrates the state that the inorganic material, the metal and/or metal compound, and the organic compound are physically mixed with each other. In this case, the "state that the components are physically mixed with each other" means not the state that each of the components forms an individual film or layer and the layers so formed are superposed upon each other, but the state that when observed microscopically each of the components forms discontinuous island like particles and the three kinds of particles overlap with each other, thus forming the light-sensitive layer on the support. The formation of such a state enables one to obtain the effects of this invention.

FIG. 2 illustrates an embodiment of the light-sensitive layer of this invention in which any one of the inorganic material, metal and/or metal compound, and organic compound is formed as a layer on the support and the others are in the state that they are physically mixed with each other as above defined, thus forming the total light-sensitive layer. For those embodiments where a layer is used, preferred layer thicknesses are about 300 Å to about 10μ. On the other hand, when any materials are used in the form of particles they preferably have an average particle size of about 30 Å to about 0.5μ.

FIG. 3 illustrates an embodiment of the light-sensitive layer of this invention in which any two of the inorganic material, metal and/or metal compound (considered as one), and organic compound are provided on the support in the state that they are physically mixed with each other, and on the layer so formed is provided a layer of the remaining one, thus forming the total light-sensitive layer.

As is apparent from the above description, in any of these embodiments, the inorganic material, metal and/or metal compound, and organic compound are provided on the support in a state that they are in contact with each other.

In more detail, the light-sensitive layer of the structure illustrated in FIG. 1 is available in one type, the light-sensitive layer of the structure illustrated in FIG. 2 is available in three types, since any one of the inorganic material, metal and/or metal compound, and organic compound is formed as a layer on the support, and the others are provided on the layer in the state that they are physically mixed with each other, and the light-sensitive layer of the structure illustrated in FIG. 3 is available in three types. Thus, there are present seven combinations.

Next, the formation of the light-sensitive layer of the non-treatment type planographic printing plate of material of this invention using four kinds of materials, two of them being selected from one group of the inorganic material, metal or metal compound, and organic compound, and the others being selected from the other two groups, will be illustrated.

Figure 4:
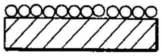

FIGS. 4 to 14 illustrate possible layer structures. FIG. 4 illustrates the state where four kinds of materials are mixed with each other, which is of the same structure as illustrated in FIG. 1. The light-sensitive layer of this structure is available in three types.

Figure 5:
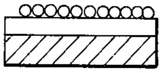

FIG. 5 illustrates an embodiment of the light-sensitive layer of this invention in which one of the four materials is formed as a layer on the support and the other three materials are provided on the layer in the state that they are physically mixed with each other. This type of structure is available in 12 types since it is available in 4 types depending upon the combination of the materials to be used, and, moreover, there are 3 types in which two materials which fall in the same group are selected from the three groups of the inorganic material, metal or metal compound, and organic compound.

Figure 6:
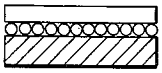

FIG. 6 illustrates the reverse of the layer structure illustrated in FIG. 5, in which three materials are provided on the support in the state that they are mixed with each other and the remaining one material is formed as a layer thereon. This structure is available in 12 types as in the case of FIG. 5.

Figure 7:
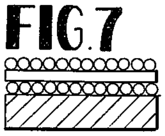

FIG. 7 illustrates an embodiment of the light-sensitive layer of this invention in which two kinds of materials are provided on the support in the state that they are mixed with each other, another material is provided as a layer on the layer so provided, and the remaining one material is attached or absorbed thereon in the state of discontinuous island like particles so that it does not form a complete layer, or the reverse thereof in which one material is provided on the support in the state of discontinuous island like particles so that it does not form a complete layer, another material is provided as a layer thereon, and the remaining two materials are provided on the layer in the state that they are physically mixed with each other. This type of structure is available in 36 types.

FIGS. 8 to 12 illustrate structures in which two of the four materials form complete layers.

Figure 8:
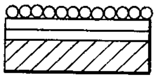

FIG. 8 illustrates the structure in which two kinds of materials are formed on the support as complete layers and the other two materials are provided thereon in the state that they are mixed with each other, which is available in 18 types.

Figure 9:
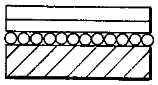

FIG. 9 illustrates the reverse of FIG. 8, in which two kinds of materials are provided on the support in the state that they are mixed with each other and the remaining two kinds of materials are provided thereon as complete layers. This structure is available in 18 types as in FIG. 8.

Figure 10:
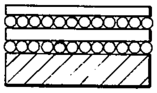

FIG. 10 illustrates the structure in which one kind of material is attached to the support in the state of discontinuous island like particles so that it does not form a complete layer, another material is provided thereon as a complete layer, another material is provided thereon in the state of discontinuous island like particles so that it does not form a complete layer, and the remaining one is provided in such a manner that it forms a complete layer. This kind of structure is available in 36 types.

Figure 11:
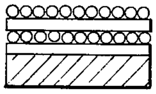

FIG. 11 illustrates the reverse structure of FIG. 10, in which one material is provided on the support as a layer, another material is provided thereon in the state of discontinuous island like particles so that it does not form a complete layer, another material is provided thereon as a layer, and the last material is provided thereon in the state of discontinuous island like particles so that it does not form a complete layer. This kind of structure is available in 36 types as in FIG. 10.

Figure 12:
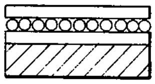

FIG. 12 illustrates the structure in which one material is provided on the support as a layer, the other two materials are provided thereon in the state that they are physically mixed with each other, and the last material is provided thereon as a layer. This kind of structure is available in 36 types.

Figure 13:
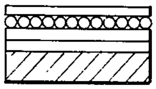
Figure 14:
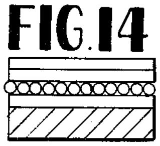

FIGS. 13 and 14 illustrate the structures in which three of the four materials are formed as layers.

FIG. 13 illustrates the structure in which two materials are provided on the support as complete layers, another material is provided thereon in the state of discontinuous island like particles so that it does not form a complete layer, and the last one is provided thereon as a layer. This kind of structure is avialable in 36 types.

FIG. 14 illustrates the reverse structure of FIG. 13, in which one material is provided on the support as a layer, another material is provided thereon in the state of discontinuous island like particles so that it does not form a complete layer, and the remaining two materials are provided thereon as complete layers. This kind of structure is available in 36 types as in FIG. 13.

As described above in detail, the structure of the light-sensitive layer of this invention, in which the inorganic material, at least one of the metal and the metal compound, and at least one organic compound capable of affecting the mutual reaction are provided on the support in the state that they come in contact with each other, is available in a number of types. For instance, where one material is selected from each of the groups, the three materials are provided in the structures illustrated in FIGS. 1 through 3. These structures are available in 7 types. On the other hand, where two materials are selected from one group and the other two materials are each selected from the other two groups, they are provided in the structures illustrated in FIGS. 4 through 14. These structures are available in 279 types. Of course, the kinds of materials selected are not limited to the above three or four ones, and sometimes five or more materials can be used to achieve the objects of this invention. In this case, the number of the possible structures markedly increases.

In the above description, the word "physically" used in the passage "the state that they are physically mixed with each other or are present in admixture with each other" is intended to mean that ingredients are not subjected positively to a chemical reaction, and, thus, it is to be noted that the presence of a product by physical absorption, chemical absorption, or a mere partial chemical reaction is expected.

The "state that the ingredients are physically mixed with each other" means that each ingredient forms discontinuous island like particles microscopically, and these particles contact with each other. Thus, the conditions required for the formation of such a surface condition are that, in general, two or more kinds of materials should not form individual complete layers, but should always be provided in the state of discontinuous island like particles.

Of course, at the boundary between two materials laminated upon each other, such two materials are apparently in contact with each other. Thus, where two ingredients are formed in "the state of physically mixed state" on a layer of another ingredient, these three ingredients are in the state of being "overlapped with each other" as described above. Also, where two materials are provided as layers and the other material is provided between the layers in the state of discontinuous island like particles so that it does not form a complete layer, these three materials constitute the state that they have contact areas in accordance with this invention.

In this invention, therefore, the formation of the state of discontinuous island like particles and the contact state of each component is an important aspect.

The formation of the state of discontinuous island like particles is achieved, for example, by vapor deposition. According to this method, a mesh screen is overlaid on the vapor deposition surface and a material is vapor deposited in vacuo, so that the material is provided in the state of discontinuous island like particles. Then, on the material so vapor deposited there is overlaid a mesh screen, and another material is vapor deposited in vacuo so that it is provided in the state of discontinuous island like particles, whereby the above two materials are provided in the state that they are mixed with each other. Of course, in effecting vapor deposition of the second material, the superposition of the mesh screen should be controlled so that there are formed areas where the second material is suitably overlaid on the first material. That is to say, the mesh screen should not be superposed in such a manner that all of the second material to be vapor deposited attaches onto the first material already vapor deposited, and it should be controlled so that the second material does not attach only onto the vapor deposition surface which has been exposed without being covered with the first material.

This discontinuous state can be attained by setting a mesh screen on the support, and vapor depositing thereon the first material, then resetting the mesh screen on the support at a slightly shifted position and vapor depositing the second material, since the mesh screen is hardly reset at exactly the same position as for the first deposition.

Where the first and second materials are vapor deposited, mesh screens having different pitches or having openings with different sizes may be used. The member to be superposed need not always be one having regular openings such as a mesh screen, and a mask in which irregular openings such as a pattern of a grained screen are irregularly arranged may be used. However, where any one or all of the inorganic material, metal or metal compound, and organic compound are vapor deposited according to the above method, it is impossible to increase the resolving power to more than the pitch of the opening of the mask. Thus, it is necessary to use a mask having very small openings or a very small pitch (up to 100 mesh), and the use of such a mask suffers from certain limitations.

As described above, the use of a mask is naturally limited in its resolving power, and to increase the resolving power, it is necessary to deposit each of the components in the insular pattern (consisting of the island like particles) having a finer pitch. As a result of various experiments on this matter, it was found that vapor deposition in a specific amount enables one to form an insular pattern of fine pitch, whereby it is possible to form a very effective discontinuous island like particle state.

The following discussion relates to the conditions for forming an island like discontinuous state. In order to obtain the three components in contact with each other, at least one of these components must be in the state of a discontinuous island like pattern (must have an insufficient thickness to form a film), for example, when the components are deposited at an average thickness of 10 Å (in other words, a deposition amount of 1.0 $\mu g/cm^2$), these components are in contact with each other. On the contrary, with, e.g., a thickness of $10\mu$ or more components can form a film and then these components will not be in contact.

The mechanism of vapor deposition is very complicated and is not well known. Electron microscopy suggests that the growth of vapor deposited substances sometimes follows the stages of: (1) formation and growth of nuclei; (2) aggregation of the particles; and (3) repeated aggregation to form a continuous film. In particular, investigators vapor depositing a film of gold reported that the particle density increased until the vapor deposited amount became 0.6 $\mu g/cm^2$ and then the particle density decreased exponentially. This can be explained if the formation of nuclei predominates until the vapor deposited amount becomes about 0.6 $\mu g/cm^2$, whereafter aggregation predominates. Also, the particle sizes are in a Gaussian distribution with the particle size increasing as the vapor deposited amount increases. The maximum particle size in a gold thin film deposited in an amount of 1.0 $\mu g/cm^2$ is said to be 60 Å to 80 Å. Also, it has been observed that, until the deposited amount becomes about 6 $\mu g/cm^2$, the particle size distribution is quite uniform, but at about 20 $\mu g/cm^2$ the particle form becomes extremely irregular and elongated particles increase in number and the length of such particles becomes 2,000 to 3,000 Å. Also, the electrical resistance of a thin film of gold, copper or aluminum drops sharply at 32 to 34 μg/cm². From this, it appears that many bridges are formed in the island like deposits just at this stage. The relationship between the deposited amount and the island like form depends upon the kind, form and temperature of the underlying substance, gases adsorbed on the underlying substance, the degree of vacuum upon vapor deposition, and the vapor depositing rate. However, it appears that, when the deposited amount is under 8 μg/cm², the vapor deposition is in an island like deposited state, and, up to 34 μg/cm², it is in the stage of coalescence of the island like deposits, and, up to 50 μg/cm², the vapor deposition is mesh like or net like in form, and, when the deposited amount exceeds 80 μg/cm², a continuous film (layer) is formed.

The above description is applicable only to the case where a fairly smooth surface is used, and it is considered that in the case of a surface with irregularities of more than 1μ, e.g., a sand grained surface, a very different behavior takes place. However, with the insular discontinuous film needed in this invention, it is clear that even a vapor deposited film obtained by vapor depositing at an amount of deposit of below about 60 μg/cm² is sufficient in capability, and resolving power is increased.

When the depositions are in a discontinuous island like state, that is, not as a uniform film, a definition of a thickness is meaningless. Therefore, in such a state, the deposition amount (μg/cm²) is a better means to define the same. On the other hand, at a deposition amount enough to form a uniform layer, the thickness (Å) can be used to define the same. It is difficult to define a strict minimum thickness necessary to form a uniform layer, but in accordance with the present invention, such a minimum thickness is generally about 300 Å.

Hereinafter, the amounts of the components ((A) inorganic material, (B) at least one metal or metal compound, and (C) organic compound) are given. When a planographic printing plate material is as in FIG. 1, the deposition of (A), (B) and (C) must be in a co-mixing state, and each component should have thickness of less than 300 Å. Preferred deposition amounts thereof are 0.1 to 10 μg/cm² for (A), 0.03 to 30 μg/cm² for (B) and 0.1 to 3 μg/cm² for (C). If the planographic printing plate material has a construction as in FIG. 2 or FIG. 3, one component must be deposited in a film like state so that the thickness thereof is 300 Å to 10μ. The other two components have a thickness and an amount as defined for FIG. 1 above. Furthermore, while not illustrated, the present invention can be attained with a planographic printing plate material having a structure of two layers of the two components and one discontinuous island like particulate state. In this case, the layers each have a thickness of 300 Å to 10μ, and the other is less than 300 Å thick. In the planographic printing plate material having the constitution of FIG. 4 to FIG. 14, a layer like deposition has a thickness of 300 Å to 10μ, and the discontinuous island like particulate material has a thickness of less than 300 Å.

While not to be construed as limitative, component (A)-inorganic material, component (B)-metal or metal compound, and component (C)-organic ocmpound, are preferably used at a ratio of 100:1 to 300:0.3 to 30 by weight.

As well known methods of producing a thin film, in addition to vacuum vapor deposition, sputtering, ion plating, electrophoretic deposition, gas phase separation, spraying, and like methods are known (the above described methods are disclosed in *Handbook of Thin Film Technology,* L. I. Maissel & R. Glang ed.), and it goes without saying that any of the above methods can be used, provided that the above embodiment is attained.

Sputtering and ion plating are similar to vacuum vapor deposition and are effective in producing the planographic printing plate material of this invention. For instance, for the deposition of a metal or metal compound, DC sputtering is mainly used, and for the deposition of a composition containing germanium and sulfur, AC sputtering is suitably used.

In using vacuum deposition to form a planographic printing plate material, the inorganic material, metal or metal compound, and organic compound each is heated and thereby deposited by dissolution or sublimation thereof, e.g., at 450° to 600° C. for a Ge-S composition, and 250° to 290° C. for 2-mercapto-5-lauroamidobenzimidazole as the organic compound. The vacuum deposition rate is preferably 1 to 50 Å/sec.

In the case that the above vapor deposition method is used for the formation of the state of discontinuous island like particles and a layer of an organic material, those organic materials capable of being vapor deposited without thermal dissociation are limited, and other organic materials can be formed in the state of the discontinuous island like particles by dipping the support, or the support on which material has already been deposited, in a solution prepared by dissolving the organic material in a solvent; followed by sufficient drying. In this case, although the organic material is vaporized to some extent with the solvent, a sufficient amount of the organic material remains on the support. The amount of deposit can be controlled by controlling the concentration of the solution. As the solvent, water, methyl alcohol, ethyl alcohol, propyl alcohol and the like can be used. A suitable concentration range is 0.01 to 0.2 weight %. Of course, it is also possible to deposit the inorganic material, or metal or metal compound from a solution thereof. For instance, where silver is provided as the metal, good results are obtained by dipping in a solution of silver nitrate, silver acetate, silver sulfate, etc., in water, alcohols and the like. To provide copper, copper nitrate, copper acetate, copper sulfate and the like are preferably used. In using the above dipping method for the other metals, metal salts of sulfuric acid are preferably used. A preferred concentration for the solutions thereof ranges from 0.05 to 2% by weight. The dipping is conducted for 10 seconds to 2 minutes at room temperature, and the dipping solution is preferably at 10° to 40° C. In the case of using an aqueous solution thereof, such may be subjected to immersion in an alcohol for a few second after deposition of the metal so as to facilitate a uniform drying of the same.

The non-treatment type planogrpahic printing plate material of this invention obtained as described above can be mounted on a printing machine and printed immediately after exposure.

Comparison of the planogrpahic printing plate produced using the composition in which an organic compound is used according to this invention with one in which the organic compound is not used makes it clear that the printing plate of this invention has a marked difference between hydrophilic and oleophilic areas of the surface thereof and its printing surface is free from contamination. The printing plate obtained with addition of the organic compound of this invention has a beautiful plate surface because of the large difference between its hydrophilicity and oleophilicity, although the printing plate obtained in the absence of the organic material has a dirty plate surface because of the small difference between its hydrophilicty and oleophilicity. Furthermore, the planographic printing plate of this invention has various characteristics, for example, the printing capability of the printing surface is very stable, and its resistance to printing is excellent, for example, several ten thousand copies can be produced. In addition, it is surprising that the non-treatment type planographic printing plate material of this invention has an improved shelf like due to the deposition the organic material in accordance with this invention. Thus, this invention is very useful.

This invention will be illustrated in more detail by reference to the following Examples. In the following Examples, when (A)-the inorganic material, (B)-at least one metal and/or metal compound, and (C)-the organic compound are used in an amount more than 10 $\mu g/cm^2$, 30 $\mu g/cm^2$ and 3 $\mu g/cm^2$, respectively, each component is in the form of film, and when used in an amount less than the above, each is present in an island like discontinuous state.

EXAMPLE 1

An inorganic material having the composition $GeS_{2.5}$ (wherein the subscript indicates the atomic ratio, hereinafter the same) was produced by melting germanium having a purity of 99.999% and sulfur in vacuo, and rapidly cooling, 150 mg of this inorganic material as an evaporation source was placed in an alumina coated tungsten basket arranged in a vacuum vapor deposition apparatus, and a 300 mm×400 mm aluminum plate, which had been sand grained and subjected to anodic oxidation (anodic oxidation in an amount of 2.4 $g/m^2$ in a 20% by weight solution of sulfuric acid in water at 25° C.), was bent so as to have a slight curvature and placed in the vacuum vapor deposition apparatus at a distance of about 30 cm from the above evaporation source. The apparatus was evacuated to a degree of vacuum of $5\times10^{-5}$ Torr and the above inorganic material vapor deposited until the amount of deposit reached 15 $\mu g/cm^2$. Subsequently, in the same manner as described above, 20 mg of 1-phenyl-5-mercaptotetrazole was placed in the above basket and vapor deposited until the amount of deposit reached 0.6 $\mu g/cm^2$, and then 100 mg of silver having a purity of 99.99% was placed in the above basket and vapor deposited until the amount of deposit reached 6.0 $\mu g/cm^2$, whereby non-treatment type planographic printing plate material of this invention was produced. In this case, the above described amount of deposit was determined by reading the value indicated by a monitor (DTM-200 type monitor produced by Sloan Co., U.S.A) connected to the vacuum vapor deposition apparatus. The case is the same with the following Examples and Comparison Examples.

Onto the vapor deposited surface on this member there was then superposed a positive type exposure mask, which was then exposed to light for 1.5 minutes by means of the exposure apparatus "PS light" (exposure apparatus "PS light" (output 2 kw), produced by Fuji Photo Film Co., Ltd., which is hereinafter referred to merely as a "PS light"), whereupon a sharp positive image was obtained. This member was then mounted on a planographic printing machine, 600 CD (planographic printing machine produced by Hamada Printing Machine Co., Hamada Star 600 CD, which is hereinafter referred to merely as "600 CD") without any other treatment. After treatment with wetting water as is employed is conventional planographic printing was applied onto the image surface, ink was placed thereon, and thus a positively inked planographic printing plate was obtained. Using this printing plate, 2,000 copies were printed.

Further, a non-treatment type planographic printing plate material was produced by the same procedure as used above. After this printing plate material was allowed to stand in a dark room for 1 month, this material was processed by the same procedures (i.e., exposure to light, printing, etc.) as used above. Excellent copies having as sharp an image as that obtained using the material before storage were obtained. Thus, no deterioration in quality of the printing plate material of this invention due to storage was observed.

On the other hand, as a comparison sample, a planographic printing plate material was produced by the same procedure as used above except that the vacuum vapor deposition of 1-phenyl-5-mercaptotetrazole was omitted. This comparison sample was quite inferior in oleophilic or ink-receptive properties, and sharp images could not be obtained even though the same printing procedure as was used above was applied.

Further, the same procedure as used for the above comparison sample was repeated to prepare a non-treatment type planographic plate material, and the thus obtained printing plate material was stored in a dark room for three days. Using this printing plate material, the same exposure and printing procedures as were used above were repeated. However, copies having a less sharp image were obtained in comparison with those obtained using the above comparative printing plate material before storage. Thus, a deterioration in quality due to storage was observed.

Thus, it was confirmed that the sample of Example 1, as compared with the comparison sample, had a marked difference between hydrophilic and oleophilic areas, had good printing properties and fairly increased sensitivity.

In the following Examples, unless indicated to the contrary, all processing conditions and product characteristics were as in Example 1, i.e., unless otherwise indicated the deposition conditions, exposure and printing conditions were as in Example 1.

EXAMPLES 2 TO 23

In the same manner as in Example 1, a planographic printing plate material was produced by vapor depositing on an aluminum plate, which had been sand grained and subjected to anodic oxidation as in Example 1, an inorganic material having the composition $GeS_{2.5}$ in a deposited amount of 15 $\mu g/cm^2$ at a degree of vacuum of $5\times10^{-5}$ Torr, the organic compound (a) shown in Table 1 in the deposited amount (b) shown in Table 1, and then silver in a deposited amount of 6.0 $\mu g/cm^2$. This planographic printing plate material was exposed to light for the period (t) shown in Table 1 by the use of a PS light, and then mounted on a printing machine without applying any other treatment. Upon treatment using wetting water and inking, which are conventional planographic printing operations, a positively inked planographic printing plate was obtained. On printing with this printing plate, in each case, 500 sheets of paper could be printed.

TABLE 1

| Example | Organic Compound (a) | Deposited Amount (b) ($\mu g/cm^2$) | Exposure Time (t) (minute) |
|---|---|---|---|
| 2 | 1-(m-caproamidophenyl)-5-mercaptotetrazole 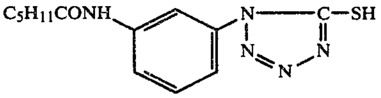 | 0.6 | 3 |
| 3 | 1-phenyl-5-mercaptotetrazole 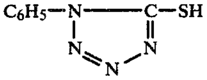 | 2.4 | 1.5 |
| 4 | 3-methyl-4-phenyl-5-mercapto-1,2,4-triazole 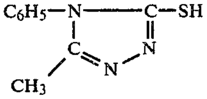 | 1.2 | 1.5 |
| 5 | 3,4-dimethyl-5-mercapto-1,2,4-triazole 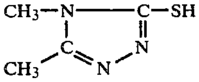 | 1.9 | 3 |
| 6 | 3-(p-caproamidophenyl)-4-ethyl-5-mercapto-1,2,4-triazole 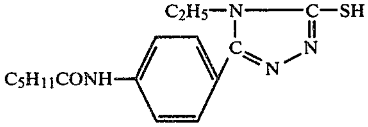 | 0.5 | 1.5 |
| 7 | 3-n-undecyl-4-phenyl-5-mercapto-1,2,4-triazole 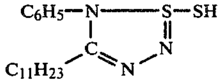 | 0.3 | 3 |
| 8 | 1,5-dimercapto-3,7-diphenyl[1,2,4]triazolo-[1,2,a][1,2,4]triazole 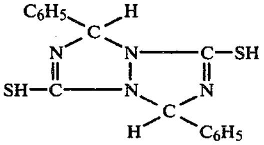 | 0.6 | 3 |
| 9 | 1-phenyl-2-mercaptoimidazole 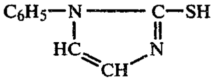 | 0.6 | 3 |
| 10 | 2-hexadecylthioimidazoline hydrogen bromide salt 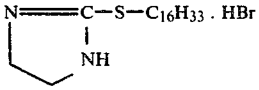 | 1.2 | 1.5 |
| 11 | 2-thioxo-4-oxothiazoline 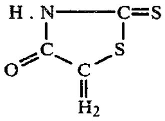 | 1.2 | 3 |
| 12 | 2,5-dimercapto-1,3,4-thiazole 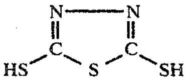 | 0.15 | 1.5 |
| 13 | bismuthiol II 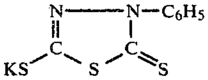 | 0.2 | 3 |
| 14 | 2-ethylthio-4-methyl-6-hydroxypyrimidine | 1.2 | 1.5 |

TABLE 1-continued

| Example | Organic Compound (a) | Deposited Amount (b) ($\mu g/cm^2$) | Exposure Time (t) (minute) |
|---|---|---|---|
| | 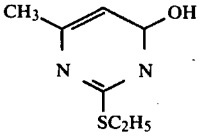 | | |
| 15 | 2-mercapto-4-hydroxy-6-methylpyrimidine 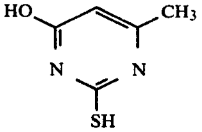 | 0.6 | 3 |
| 16 | N,N,N',N'-tetramethyl-4,4'-diaminothiobenzophenone 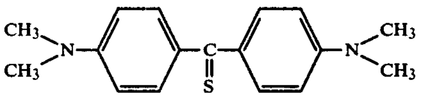 | 1.2 | 3 |
| 17 | sodium diethyldithiocarbamate 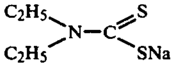 | 0.5 | 3 |
| 18 | silver diethyldithiocarbamate 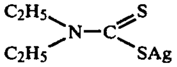 | 1.2 | 3 |
| 19 | N,N,N',N'-tetramethyl-p-phenylenediamine hydrochloric acid salt 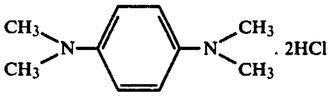 | 0.2 | 3 |
| 20 | monoethyl urea $C_2H_5NHCONH_2$ | 1.0 | 1 |
| 21 | dimethylol thiourea $(HOCH_2NH)_2CS$ | 1.1 | 1 |
| 22 | 4-phenylthiosemicarbazide 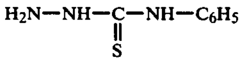 | 0.9 | 1 |
| 23 | 2,5-di(1,1-dimethylbutyl)hydroquinone 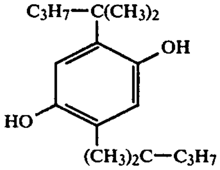 | 0.6 | 2 |

As a Comparison Example for each of the above Examples, a comparison sample was produced in the same manner as above except that the vapor deposition of the organic compound was not carried out. On effecting printing, each sample was negatively inked, and judging from the printing operation, e.g., the spreading condition of ink, it was confirmed that the oleophilic property of the image areas was quite poor.

When in each Example the sample was compared with the comparison sample with respect to printing suitability, it was confirmed that the organic compound of this invention increased the spreading of ink on the printing plate, provided printed matter bering an image of high quality, and increased sensitivity. In particular, it was astonishing from the point of practical printing that the type of printing plate changed, that is to say, the comparison sample was of the negative type, whereas the sample of this invention in which the organic compound was used was of the positive type.

EXAMPLES 24 TO 27

In the same manner as in Example 1, a planographic printing plate material of this invention was produced. In this case, as shown in Table 2, the composition and deposited amount of the inorganic material, the kind and deposited amount of the organic compound, and the kind and deposited amount of the metal were changed. This planographic printing plate material was exposed to light with the PS light for the period shown in Table 2, and upon application of the printing operations as above, a positive type printing plate was obtained, and 500 to 1,000 sheets of paper could be printed.

TABLE 2

| Example | Inorganic Compound | Amount (μg/cm²) | Organic Compound | Amount (μg/cm²) | Metal | Amount (μg/cm²) | Exposure Period (min) | Number of Printed Sheets |
|---|---|---|---|---|---|---|---|---|
| 24 | $GeS_{1.7}$ | 11 | 2-mercaptobenzothiazole 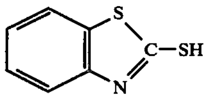 | 2.4 | Ag | 6.0 | 3 | 1,000 |
| 25 | $GeS_{2.5}$ | 15 | 2-mercapto-6-methylbenzothiazole 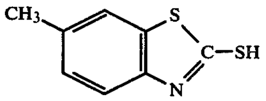 | 0.8 | Ag | 6.8 | 3 | 500 |
| 26 | $GeS_{2.5}$ | 12.5 | 2-mercaptobenzoimidazole 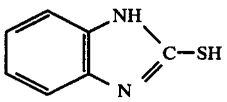 | 0.5 | Ag | 6.0 | 3 | 500 |
| 27 | $GeS_{2.5}$ | 15 | 1-phenyl-5-mercaptotetrazole | 0.6 | In | 6.0 | 3 | 500 |

On the other hand, as a comparison sample in each Example, a planographic printing plate material was produced by the same procedure as above except that the vapor deposition of the organic compound was not conducted. On printing this printing plate material, it was confirmed that it was negatively inked, the oleophilic property of the image areas was quite low, and the image quality of the printed matter obtained was inferior. In these Examples, the addition of the organic compound changed the printing plate from a negative type to a positive type, and, moreover, greatly increased the image quality of the printing surface. Thus, it can be understood that the effect of the addition of the organic compound is remarkable.

EXAMPLES 28 AND 29

A planographic printing plate material of this invention was produced in the same manner as in Example 1. In this case, as shown in Table 3, the composition and amount of the inorganic material, the kind and amount of the organic compound, and the kind and amount of the metal were changed. Each planographic printing plate material was exposed to light by means of the PS light for the period shown in Table 3, and on application of the same printing operation as above, a negative type printing plate was obtained, and 500 sheets of paper were printed.

TABLE 3

| Example | Inorganic Compound | Amount (μg/cm²) | Organic Compound | Amount (μg/cm²) | Metal | Amount (μg/cm²) | Exposure Period |
|---|---|---|---|---|---|---|---|
| 28 | $GeS_{2.5}$ | 15 | 1-(m-caproamidophenyl)-5-mercaptotetrazole 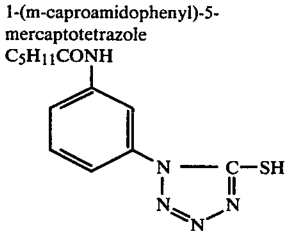 | 1.8 | Ag | 6.0 | 1.5 |
| 29 | $GeS_{2.5}$ | 15 | 2-mercapto-5-lauroamidobenzimidazole 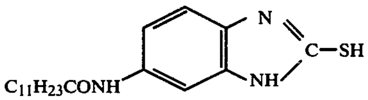 | 0.6 | Ag | 4.0 | 3 |

For comparison with the samples of this Example, samples not containing any organic compound were prepared. Since these samples were negatively inked, there was no change in the type of plate. However, the printed products were inferior in image quality. Thus, the effect of the addition of the organic compound was sufficiently observed.

EXAMPLES 30 TO 38

In the same manner as in Example 1, on an aluminum plate, which had been sand grained and subjected to anodic oxidation as in Example 1, were vapor deposited the inorganic material at a degree of vacuum of $5\times10^{-5}$ Torr, and then the organic compound, and further the metal or metal compound, the composition of the inorganic material, the kind of the organic compound, and the kind of the metal or metal compound being shown in Table 4. Thus, a planographic printing plate material of this invention was obtained. This planographic printing plate material was exposed to light with a PS light for the period shown in Table 4, and mounted on a planographic printing machine without applying any other treatment. Then conventional planographic printing operations, treatment with wetting water and spreading of ink were applied, whereby a positively or negatively inked planographic printing plate was obtained. On printing using this printing plate, the number of copies shown in Table 4 was obtained.

TABLE 4**

| Example | Inorganic Material | Amount ($\mu g/cm^2$) | Organic Compound | Amount ($\mu g/cm^2$) | Metal | Amount ($\mu g/cm^2$) | Exposure Time (min) | Type of Plate (P,N*) | Number of Printed Sheets |
|---|---|---|---|---|---|---|---|---|---|
| 30 | $GeS_2$ | 15 | 1-phenyl-5-mercaptotetrazole | 0.6 | Ag | 6.0 | 1 | P | 1,000 |
| 31 | $Ge_{35}S_{60}P_5$ | 13 | N-phenyl-β-naphthylamine | 0.15 | Ag | 0.2 | 8 | P | 300 |
| 32 | $GeS_{2.5}$ | 15 | 2-mercapto-4-hydroxy-6-methyl-1,3,3a,7-tetrazaindene 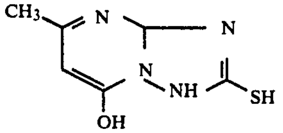 | 1.0 | AgI | 0.85 | 3.5 | N | 300 |
| 33 | $SnS_2$ | 24 | 1-phenyl-5-mercaptotetrazole | 0.6 | Ag | 0.6 | 10 | P | 500 |

*P = positive
N = negative
**The order of the deposition was inorganic material, organic compound, and metal, from the support.

Subsequently, the order of the vapor deposition of the organic compound and the metal or metal compound was changed, and the other operations were conducted in the same manner as above. The results are shown in Table 5.

TABLE 5*

| Ex. | Inorganic Material | Amount ($\mu g/cm^2$) | Metal | Amount ($\mu g/cm^2$) | Organic Compound | Amount ($\mu g/cm^2$) | Exposure Time (min) | Type of Plate (P,N**) | Number of Printed Sheets |
|---|---|---|---|---|---|---|---|---|---|
| 34 | $GeS_2$ | 15 | Ag | 6.0 | 1-phenyl-5-mercaptotetrazole | 0.6 | 2 | P | 1,000 |
| 35 | $Ge_{35}S_{60}Zn_5$ | 15 | Ag | 6.0 | 1,3,3-trimethyl-6'-nitrospiro(indoline-2,2'-benzo-α-pyran) 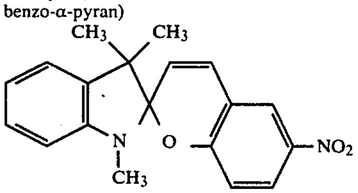 | 2.0 | 2 | P | 500 |
| 36 | $GeS_{2.5}$ | 15 | AgI | 0.85 | 2-mercapto-4-hydroxy-6-methyl-1,3,3a,7-tetrazaindene | 0.1 | 3.5 | N | 500 |
| 37 | $GeS_{1.7}$ | 15 | Cu | 10 | 1-phenyl-5-mercaptotetrazole | 0.5 | 1 | P | 500 |
| 38 | $GeS_{2.5}$ | 3.0 | AgI | 0.9 | 1-phenyl-5-mercaptotetrazole | 0.17 | 3.5 | N | 500 |

*The order of the deposition was inorganic material, metal, and organic material, from the support.
**Same as Table 4.

For comparison with the samples of Examples 30 to 38, samples containing no organic compound were prepared. None of these samples could be inked, and with these samples, it was impossible to effect printing. Thus, it can be understood that in Examples 30 to 38, the effect of adding the organic compound was remarkable.

EXAMPLE 39

In the same manner as in Example 1, on an aluminum plate which had been sand grained as in Example 1, there was vapor deposited an inorganic material of the composition $GeS_{2.5}$ at a degree of vacuum of $5\times10^{-5}$ Torr until the deposited amount reached 36 $\mu g/cm^2$. Subsequently, a stainless steel mesh (optical transmittance, 28%) of 500 mesh was brought into close contact with the above vapor deposited film, and the system held in a vacuum vapor deposition apparatus, whereafter 1-phenyl-5-mercaptotetrazole was vapor deposited through the above stainless steel mesh on the above vapor deposited film in a discontinuous state at a degree of vacuum until the deposited amount reached 2.4 $\mu g/cm^2$. The above stainless steel mesh was then removed, and, thereafter, the stainless steel mesh was again placed on the above vapor deposited film, and Ag was vapor deposited on the above vapor deposited film in a discontinuous state at a degree of vacuum of $5\times10^{-5}$ Torr until the deposited amount reached 24 $\mu g/cm^2$. The thus prepared member was exposed to light with a Jet-Printer 2000 for 3 minutes, and treated with wetting water and then with developing ink, whereby a positively inked planographic printing plate was obtained.

As a comparison sample to the sample of this invention, a planographic printing plate was produced in the same manner as above except that the vapor deposition of the organic compound was omitted. With this printing plate, ink was not spread on the surface of the plate, and, thus, it could not be printed. In this way, the effect of adding the organic compound was marked.

EXAMPLES 40 TO 45

In each of these Examples, in the same manner as in Example 1, on an aluminum plate, which had been sand grained and subjected to anodic oxidation as in Example 1, there was vapor deposited the inorganic material having the composition shown in Table 6 at a degree of vacuum of $5 \times 10^{-5}$ Torr. Then the organic compound and the metal or metal compound shown in Table 6 were vapor deposited thereon in the amounts shown in Table 6, whereby a planographic printing plate material of this invention was obtained. This planographic printing plate material was exposed to light with the PS light for the period shown in Table 6, and mounted on a planographic printing machine without applying any other treatment. Upon the application of general planographic printing operations, treatment with wetting water and spreading of ink, a planographic printing plate which was positively inked was obtained. With this printing plate, prints of the number as shown in Table 6 could be obtained.

onds, and, furthermore, dipped in ethanol at room temperature (i.e., 22° C.) for 3 seconds and dried, whereby a planographic printing plate material of this invention was obtained. On this material there was overlaid a positive type exposure mask, which was image-wise exposed to light with a "Jet Printer 2000" (an exposure apparatus produced by Oak Manufacturing Co.) for 2 minutes, whereupon a sharp positive type image was obtained. This plate was mounted on a planographic printing machine, 600 CD, without applying any treatment, and subjected to the conventional treatment with wetting water and spreading of ink, whereby a planographic printing plate positively inked was obtained. With this planographic printing plate, 10,000 sheets of paper could be printed.

TABLE 6

| Example | Inorganic Compound | Amount ($\mu g/cm^2$) | Organic Compound | Amount ($\mu g/cm^2$) | Metal | Amount ($\mu g/cm^2$) | Exposure Period (min) | Number of Printed Sheets |
|---|---|---|---|---|---|---|---|---|
| 40 | $GeS_2$ | 4.5 | dithizone | 0.2 | Ag | 5.0 | 2 | 500 |
| 41 | $GeS_2$ | 4.5 | zinc diethylthiocarbamate | 0.3 | Ag | 5.0 | 2 | 500 |
| 42 | $GeS_{2.5}$ | 3.0 | 1-phenyl-5-mercaptotetrazole | 0.9 | AgI | 1.0 | 3.5 | 300 |
| 43 | $GeS_2$ | 4.5 | Methylene Blue | 0.5 | Ag | 5.0 | 2 | 500 |
| 44 | $GeS_2$ | 4.5 | Crystal Violet | 0.8 | Ag | 5.0 | 1 | 500 |
| 45 | $GeS_2$ | 4.5 | Behenic Acid | 1.0 | Ag | 5.0 | 1 | 500 |

EXAMPLE 46

$GeS_{2.5}$ was produced by melting Ge having a purity of 99.999% and S in vacuo and rapidly cooling. 400 mg of the resulting $GeS_{2.5}$ was placed in an alumina coated tungsten basket arranged in a vacuum vapor deposition apparatus. Then, a 300 mm×460 mm aluminum plate, which had been sand grained and subjected to anodic oxidation, was bent so as to have a slight curvature and placed in the vacuum vapor deposition apparatus at a distance of about 30 cm from the above evaporation source, and vacuum vapor deposition conducted until the monitor connected to the above apparatus indicated a deposited amount of 36 $\mu g/cm^2$. The thus obtained deposit was dipped in a 0.06% by weight solution at room temperature (i.e., 22° C.) of 1-phenyl-5-mercaptotetrazole in ethanol for 15 seconds, dried at room temperature (22°), and then dipped in a 0.5% by weight solution at room temperature (i.e., 22° C.) of silver nitrate in water for 60 seconds, water washed for 30 sec-

EXAMPLES 47 TO 58

In these Examples, as in Example 46, on an aluminum plate, which had been sand grained and subjected to anodic oxidation, there was vapor deposited an inorganic material having the composition $GeS_{2.5}$ at a degree of vacuum of $5 \times 10^{-5}$ Torr until the deposited amount reached 36 $\mu g/cm^2$, which was then dipped in a 0.06% by weight solution at room temperature (22° C.) of the organic compound shown in Table 7 in ethanol for 15 seconds and dried, and then dipped in a 0.2% by weight solution at room temperature (22° C.) of silver nitrate in water, washed with water, dipped in ethanol, and dried, whereby a planographic printing plate material of this invention was obtained. This plate material was exposed to light with Jet Light 2000 for 1 minute, and subjected to treatment with wetting water and the spreading of ink, whereupon a positively inked planographic printing plate was obtained.

TABLE 7

| Example | Inorganic Material | Deposited Amount ($\mu g/cm^2$) | Organic Compound |
|---|---|---|---|
| 47 | $GeS_{2.5}$ | 36 | 1-(m-caproamidophenyl)-5-mercaptotetrazole 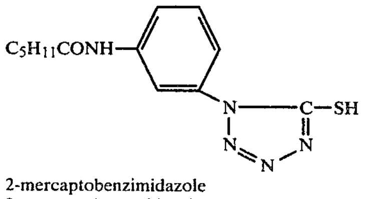 |
| 48 | " | " | 2-mercaptobenzimidazole |
| 49 | " | " | 2-mercaptobenzothiazole |
| 50 | " | " | 2-thioxo-3-(m-methoxyphenyl)-4-methyl-$\Delta^4$-1,3-thiazoline 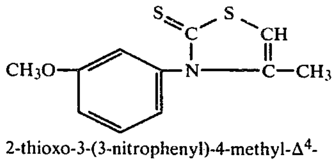 |
| 51 | " | " | 2-thioxo-3-(3-nitrophenyl)-4-methyl-$\Delta^4$- |

TABLE 7-continued

| Example | Inorganic Material | Deposited Amount ($\mu g/cm^2$) | Organic Compound |
|---|---|---|---|
| | | | 1,3-thiazoline 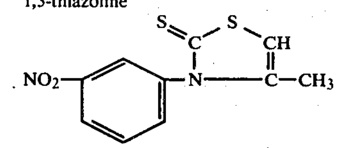 |
| 52 | " | " | 2-thioxo-3-o-toluyl-4-methyl-$\Delta^4$-1,3-thiazoline 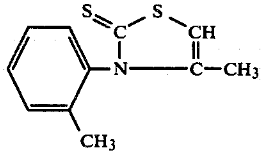 |
| 53 | " | " | 1-phenyl-5-mercaptotetrazole |
| 54 | " | " | 1,1'-didodecyl-4,4'-inylenedipyridium dibromide 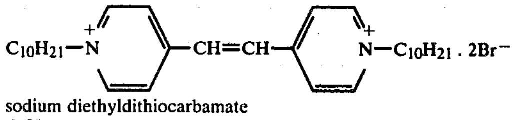 |
| 55 | " | " | sodium diethyldithiocarbamate 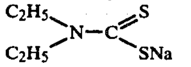 |
| 56 | " | " | dithizone 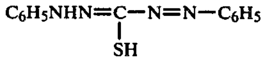 |
| 57 | " | " | N,N,N',N'-tetramethyl-4,4'-diaminothio-benzophenone (thioMichler's ketone) 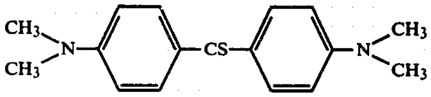 |
| 58 | " | " | 1,3-trimethyl-6'-nitrospiro(indoline-2,2'-benzo-α-pyran) |

These planographic printing plates using the organic compounds in accordance with the present invention were improved planographic printing plates capable of being positively inked. Without these organic compounds, an improved planographic printing plate could not be obtained.

EXAMPLES 59 AND 60

A planographic printing plate material was produced in the same manner as in Example 46 except that the organic compound was changed to the one shown in Table 8 and the concentration of the solution of silver nitrate in water was changed to 0.06% by weight. On printing with these materials, each of them was positively inked, and 700 to 1,000 sheets of paper could be printed.

TABLE 8

| Example | Organic Compound |
|---|---|
| 59 | 3-(p-caproamidophenyl)-4-ethyl-5-mercapto-1,2,4-triazole |
| 60 | 1-(m-benzamidophenyl)-5-mercaptotetrazole |

EXAMPLES 61 TO 64

In the same manner as in Example 46, on a sand grained aluminum plate there was vapor deposited the inorganic material shown in Table 9 at a degree of vacuum of $5\times10^{-5}$ Torr until the deposited amount reached the values shown in Table 9. Subsequently, the aluminum plate was dipped in a 0.06% by weight solution at room temperature (22° C.) of the organic compound shown in Table 9 in ethanol for 15 seconds, dipped in a 0.2% by weight solution at room temperature (22° C.) of silver nitrate in water for 60 seconds, washed with water and then with ethanol, and dried. This plate material was then image-wise exposed to light with a "PS light" for 2 minutes, mounted on a planographic printing machine without applying any treatment, and subjected to conventional water wetting and spreading of ink, whereupon the plate was positively inked. With the printing plate so produced, 500 sheets of paper could be printed.

TABLE 9

| Example | Inorganic Material | Deposited Amount ($\mu g/cm^2$) | Organic Compound |
|---|---|---|---|
| 61 | $GeS_3$ | 24 | 1-(m-caproamidophenyl)-5-mercaptotetrazole |
| 62 | $GeS_4$ | 15 | 1-(m-caproamidophenyl)-5-mercaptotetrazole |
| 63 | $GeS_4$ | 15 | 1-phenyl-5-mercaptotetrazole |
| 64 | $GeS_3$ | 36 | 2-mercapto-5-lauroamido-benzimidazole |

EXAMPLE 65

A planographic printing plate was produced in the same manner as in Example 64 except that the inorganic material, $GeS_3$ was vapor deposited in deposited amount of 24 μg/cm², and then the aluminum plate was dipped in a 0.12% by weight solution at room temperature (22° C.) of 1-phenyl-5-mercaptotetrazole in ethanol, for 15 seconds, dried, dipped in a 0.5% by weight solution at room temperature (22° C.) of silver nitrate in water for 90 seconds, washed with water and then ethanol, and dried. The planographic printing plate so produced was positively inked, and with this printing plate, 12,000 sheets of paper could be printed.

EXAMPLE 66

In the same manner as in Example 46, on an aluminum plate, which had been sand grained and subjected to anodic oxidation as in Example 1 there was vapor deposited an inorganic material, $GeS_{2.5}$, in a deposited amount of 36 μg/cm² at a degree of vacuum of $4.0\times10^{-5}$ Torr. Subsequently, the aluminum plate was dipped in a 0.01% by weight solution at room temperature (22° C.) of p-dimethylaminobenzylidene rhodamine, $p-(CH_3)_2NC_6H_4CH{=}CHCONHSCS$, in ethanol for 15 seconds and then dried. Furthermore, the aluminum plate was dipped in a 0.1% by weight solution (22° C., 90 sec.) of silver nitrate in water and then dried.

The thus prepared planographic printing plate material was image-wise exposed to light with the PS light for 2 minutes, and then subjected to water wetting and ink spreading, whereupon a positively inked printing plate was obtained. With this printing plate, about 500 sheets of paper could be printed.

EXAMPLE 67

In the same manner as in Example 46, on an aluminum plate, which had been sand grained and subjected to anodic oxidation in Example 1 there was vapor deposited an inorganic material, $GeS_3$, in deposited amount of 24 μg/cm² (degree of vacuum of $5\times10^{-5}$ Torr for the deposition). Subsequently, the aluminum plate was dipped in a 0.12% by weight solution at room temperature (22° C.) of 1-phenyl-5-mercaptotetrazole in ethanol for 15 seconds, and then dried. Furthermore, it was dipped in a 0.5% by weight solution at room temperature (22° C.) of silver nitrate in water for 90 seconds, washed with water, dipped in ethanol, and dried.

The thus produced planographic printing plate material was exposed to light with the PS light for 2 minutes, and mounted on a planographic printing machine without applying any other treatment. When this plate was subjected to the water wetting and ink spreading, it was positively inked. With this plate, 12,000 sheets of paper could be printed.

EXAMPLE 68

In the same manner as in Example 46, on an aluminum plate, which had been sand grained and subjected to anodic oxidation as in Example 1 there was vapor deposited an inorganic material, $GeS_{2.5}$, in a deposited amount of 36 μg/cm² (degree of vacuum of $5\times10^{-5}$ Torr for the deposition). Subsequently, this aluminum plate was dipped in a 0.06% by weight solution at room temperature (22° C.) of 1-phenyl-5-mercaptotetrazole in ethanol for 15 seconds, and then dried. It was then dipped in a 0.5% by weight solution at room temperature (22° C.) of silver nitrate in water for 60 seconds, washed with water, dipped in ethanol, and dried. Furthermore, it was dipped in a 0.06% by weight solution at room temperature (22° C.) of 3-(p-caproamidophenyl)-4-ethyl-5-mercapto-1,2,4-triazole in ethanol for 15 seconds and then dried.

The thus produced planographic printing plate material was exposed to light with the PS light for 2 minutes, and subjected to the water wetting and ink spreading, whereby it was positively inked. With this printing plate, about 1,000 sheets of paper could be printed.

EXAMPLE 69

In the same manner as in Example 1, on an aluminum plate were vapor deposited an inorganic material, $GeS_{2.5}$, in deposited amount of 36 μg/cm², thiourea in an amount of 1.0 μg/cm², silver in an amount of 6.0 μg/cm², and 2-mercapto-5-lauroamidobenzimidazole in an amount of 0.5 μg/cm², in this order.

The thus produced planographic printing plate material was exposed to light with Jet Printer 2000 for 2 minutes, and then subjected to water wetting and ink spreading, whereupon a positively inked planographic printing plate was obtained. With this printing plate, about 5,000 sheets of paper could be printed.

EXAMPLE 71

In the same manner as in Example 1, on an aluminum plate were vapor deposited an inorganic material, $GeS_{2.5}$, in a deposited amount of 36 μg/cm², antimony in an amount of 2.4 μg/cm², 1-phenyl-5-mercaptotetrazole in an amount of 1.0 μg/cm², and silver in an amount of 6.0 μg/cm², in this order. The thus obtained printing plate material was exposed to light with the PS light for 2 minutes, and then subjected to water wetting and ink spreading, whereby it was positively inked. With this printing plate, about 2,000 sheets of paper could be printed.

EXAMPLE 72

The procedure of Example 71 was repeated except that 1.0 μg/cm² of copper iodide was used in place of 2.4 μg/cm² of antimony. The same results as in Example 71 were obtained.

EXAMPLE 73

In the same manner as in Example 71, after the vapor deposition of $GeS_{2.5}$, 1-phenyl-5-mercaptotetrazole was vapor deposited in a deposited amount of 0.6 μg/cm², silver in an amount of 6.0 μg/cm², and then copper in an amount of 4.8 μg/cm² to thereby produce a planographic printing plate material of this invention. Printing using this printing plate material, a positively inked planographic printing plate was obtained, and about 2,000 sheets of paper could be printed.

EXAMPLES 74 TO 79

In each of these Examples, in the same manner as in Example 1, on an aluminum plate, which had been sand grained and subjected to anodic oxidation as in Example 1, there were vapor deposited $GeS_{2.5}$ in a deposited amount of 15 μg/cm² at a degree of vacuum of $5\times10^{-5}$ Torr, and then the organic compound shown in Table 10 in an amount shown therein and silver in the amount shown therein, in this order, whereby a planographic printing plate material was produced. This planographic printing plate material was exposed to light with the PS light for the period shown in Table 10 and mounted on a planographic printing machine without applying any other treatment. On applying thereto conventional planographic printing operations, treatment using wetting water and spreading of ink, a negatively inked planographic printing plate was obtained. On printing using this plate, 500 to 1,000 sheets of paper could be printed.

TABLE 10

| Example | Organic Compound | Amount ($\mu g/cm^2$) | Amount of Ag Deposited ($\mu g/cm^2$) | Exposure Time (min) |
|---|---|---|---|---|
| 74 | metanilic acid | 0.37 | 6.0 | 1 |
| | 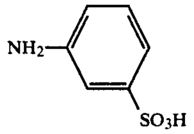 | | | |
| 75 | urea | 1.0 | 6.0 | 1 |
| 76 | methyl p-hydroxybenzoate | 0.5 | 6.0 | 2 |
| | 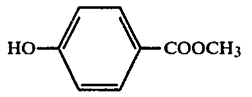 | | | |
| 77 | thiourea | 1.2 | 6.0 | 2 |
| 78 | 1,3,3-trimethyl-6'-nitrospiro(indoline-2,2'-benzo-α-pyran) | 0.5 | 0.15 | 2 |
| 79 | rhodamine B | 0.4 | 6.2 | 3 |
| | 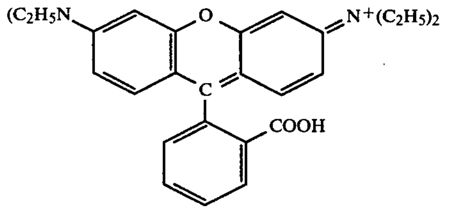 | | | |

EXAMPLE 80

In the same manner as in Example 1, on an aluminum plate, which had been sand grained and subjected to anodic oxidation as in Example 1, there were vapor deposited $As_2S_3$ in an amount of deposit of 24 $\mu g/cm^2$ at a degree of vacuum of $5\times10^{-5}$ Torr, and then 1-phenyl-5-mercaptotetrazole in an amount of 1.0 $\mu g/cm^2$ and silver in an amount of 6.0 $\mu g/cm^2$, in this order, whereby a planographic printing plate material of this invention was obtained. This printing plate material was exposed to light with the Jet Printer 2000 for 3 minutes and mounted on a planographic printing plate without applying any other treatment. On applying conventional planographic printing operations, treatment with wetting water and spreading of ink, a positively inked planographic printing plate was obtained. With this printing plate, 500 to 1,000 sheets of paper could be printed.

In this Example and the foregoing Examples, where the vapor deposition of the organic compound alone was not conducted, it was found that although the plates were negatively inked through the ink spreading, their printed surfaces were bad, and the difference in the oleophilic nature between image and non-image areas was small, and that even such characteristics markedly deteriorated with the passage of time.

While the invention has been described in detail and with reference to specific embodiments thereof, it will be apparent to one skilled in the art that various changes and modifications can be made therein without departing from the spirit and scope thereof.

What is claimed is:

1. A planographic printing plate material comprising a support and a binderless light-sensitive layer provided on said support, said light-sensitive layer being composed of:

(A) an inorganic material selected from the group consisting of (1) a sulfur group element selected from the group consisting of S, Te, Se and a mixture therof, (2) a chalcogenide composition represented by the formula M-Sulfur Group Element, M-Sulfur Group Element-X or M-Sulfur Group Element-X-Y, wherein the amount of said sulfur group element present in said chalcogenide composition is more than that of said sulfur group element stoichiometrically corresponding to the lowest valency of the atom represented by M with exception of a valency of zero; and M represents an atom of Group Ib, IIb, IIIb, IVa, IVb, Vb, VIa or VIII of the Period Table; and X and Y, which are not the same as M, each represents an atom selected from the group consisting of Al, Sb, Si, Mg, Ti, V, Mn, Co, Ni, Ta, Mo, W, Sn, Zn, Pb, Bi, Ag, Pd, In, O, P, Cl, Br and I and (3) a halide of an element selected from the group consisting of Pb, Sn and Ge, wherein the amount of the halogen present therein is more than that of said halogen stoichiometrically corresponding to a lowest valency of said element other than a valency of zero;

(B) Ag or Cu (C) an organic compound selected from the group consisting of benzotriazole; carboxylic acids; phenols; amines, hydrazines; alkylene oxide polymers; —CO—NH group-containing compounds; sulfur-containing organic compounds having at least one of an —SH group, a >C=S group, an $-(S)_n-$ group wherein n=1 to 6, an $-SO_2H$ group or an —$SO_3H$ group; selenic acids; a dye selected from the group consisting of an azo dye, an anthraquinone dye, an indigoid dye, a soluble vat dyeing dye, a sulfur dye, a carbonium dye, a quinoneimine dye, a phthalocyanine dye, a cyanine dye, a quinoline dye, a nitro dye and a nitroso dye; and spiropyrans, wherein said inorganic material (A) and said Ag or Cu (B) are capable of reacting with each other upon the application of electromagnetic radiation, said organic compound (C) is capable of affecting the reaction between said inorganic material (A) and said Ag or Cu (B), and said inorganic material (A), said Ag or Cu (B), and said organic compound (C) are all in contact with each other, at least one of said inorganic material (A), said Ag or Cu (B) and said organic compound (C) having been deposited in the form of discontinuous island-like particles, whereby upon the imagewise application of electromagnetic radiation, a difference in hydrophilic or olephilic nature is produced between the irradiated areas and the unirradiated areas of said light-sensitive layer.

2. The planographic printing plate material according to claim 1, wherein the support is selected from the group consisting of a metal plate, a plastic sheet whose surface has been rendered hydrophilic, and a sheet in which a metal plate or metal foil is laminated onto a plastic sheet or paper.

3. The planographic printing plate material according to claim 1, wherein the support is an aluminum plate or a zinc plate.

4. The planographic printing plate material according to claim 1, wherein M of said chalcogenide composition is an element of Group Ib, IVa, IVb or VIII of the Periodic Table.

5. The planographic printing plate material according to claim 4, wherein M is ge, Sn Pb, Si, Ag, Ti or Fe.

6. The planographic printing plate material according to claim 4 wherein said sulfur group element of said chalcogenide composition is sulfur.

7. The planographic printing plate material according to claim 1, wherein said halide of said element of Group IVb is $PbI_2$, $SnI_4$ or $GeI_4$.

8. The planographic printing plate material according to claim 1, wherein said inorganic material (A) is a composition containing germanium and sulfur.

9. The planographic printing plate material according to claim 1, wherein said organic compound (C) is benzotriazole.

10. The planographic printing plate material according to claim 1, wherein said organic compound (C) is sulfur-containing organic compound.

11. The planographic printing plate material according to claim 10, wherein said sulfur-containing organic compound is selected from the group consisting of:

(1) a thiourea represented by the following formula:

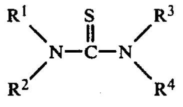

wherein $R^1$ to $R^4$ each represents a hydrogen atom, an alkyl group, an hydroxyalkyl group having 1 to 5 carbon atoms, or a phenyl group; and wherein either $R^1$ and $R^2$ or $R^3$ and $R^4$ may combine and form a 5-membered heterocyclic ring;

(2) a thiosemicarbazide or a thiocarbazide represented by the following formulae and derivatives thereof:

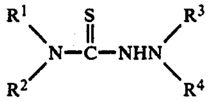

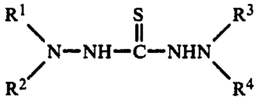

wherein $R^1$ to $R^4$ each represents a hydrogen atom, an alkyl group having 1 to 5 carbon atoms, or a phenyl group;

(3) a dithiocarbamic acid represented by the following formula:

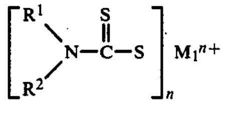

wherein $R^1$ and $R^2$ each represents a hydrogen atom, an alkyl group having 1 to 5 carbon atoms, an aralkyl group having 7 to 9 carbon atoms, or a phenyl group; wherein $M_1$ represents a hydrogen atom or a metal ion having a valency represented by n; and wherein n represents 1 to 2;

(4) a thiobenzophenone represented by the following formula:

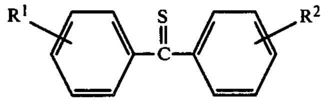

wherein $R^1$ and $R^2$ each represents a hydrogen atom, an alkyl group having 1 to 5 carbon atoms, an alkoxy group having 1 to 5 carbon atoms, an amino group substituted with 2 alkyl groups which each may have 1 to 5 carbon atoms, a chlorine atom, a bromine atom or an iodine atom;

(5) a 5-membered ring or a derivative thereof containing a sulfur atom as one member of the ring;

(6) an imidazole or benzimidazole each of which is substituted with any of an —SH group, an =S group or an —S—R group, wherein R represents an alkyl group having up to 20 carbon atoms, an alkenyl group having up to 20 carbon atoms or a phenyl group, and each of which can be further substituted with at least one of an alkyl group having 1 to 20 carbon atoms, an alkylamido group having 2 to 21 carbon atoms, and a phenyl group;

(7) an imidazoline substituted with any of an —SH group, an =S group or an —S—R group, wherein R represents an alkyl group having up to 20 carbon atoms, an alkenyl group having up to 20 carbon atoms or a phenyl group;

(8) a trizole or benzotriazole, each of which is substituted with any of an —SH group, an =S group or an —S—R group, wherein R represents an alkyl group having up to 20 carbon atoms, an alkenyl group having up to 20 carbon atoms or a phenyl group, and each of which can be further substituted with at least one of 1 or 2 alkyl groups having 1 to 20 carbon atoms, a phenyl group and a phenyl group substituted with an alkylamido group having 2 to 20 carbon atoms;

(9) a tetrazole substituted with any of an —SH group, an =S group or an —S—R group, wherein R represents an alkyl group having up to 20 carbon atoms, an alkenyl group having up to 20 carbon atoms or a phenyl group, and which can be further substituted with 1 or 2 alkyl groups having 1 to 5 carbon atoms, a phenyl group, or a phenyl group substituted with at least one of a benzamido group and an alkylamido group having 2 to 21 carbon atoms;

(10) a pyrimidine substituted with any one of an —SH group, an =S group or an —S—R group, wherein R represents an alkyl group having up to 20 carbon atoms, an alkenyl group having up to 20 carbon atoms or a phenyl group, and which can be further substituted with 1 or more alkyl groups having 1 to 5 carbon atoms or with an oxo group; and

(11) a tetrazaindene substituted with any of an —SH group, an =S group or an —S—R group, wherein R represents an alkyl group having up to 20 carbon atoms, an alkenyl group having up to 20 carbon atoms or a phenyl group, and which can be further substituted with an alkyl group having 1 to 3 carbon atoms or a hydroxyl group.

12. The planographic printing plate material according to claim 11, wherein said 5-membered ring or said derivative thereof containing a sulfur atom as one member of the ring is selected from the group consisting of a dithiolan; a thiazole or benzothiazole, each of which can be substituted with at least one of an alkyl group having 1 to 5 carbon atoms, an acetylthioacetamido group, an $—NH_2$ group and an —SH group; a thiazoline; a rhodanine, an isorhodanine; a thiazolidine; and a thiadiazole.

13. The planographic printing plate material according to claim 1, wherein said organic compound (C) is a dye.

14. The planographic printing plate material according to claim 13, wherein said dye is selected from the group consisting of Methylene Blue, Crystal Violet or Rhodamine B.

15. The planographic printing plate material according to claim 1, wherein said organic compound (C) is a spiropyran.

16. The planographic printing plate material according to claim 15, wherein said spiropyran is selected from the group consisting of 1,3,3-trimethyl-6′-nitro-spiro(indoline-2,2′-benzo-α-pyran),
3-(3-sulfopropyl)-5-chloro-6′-nitrospiro(benzothiazoline-2,2′-benzo-α-pyran),
1,3,3,-trimethyl-6′,8′-dibromo-7′-nitrospiro(indoline-2,2′-benzo-α-pyran),
1,3,3-trimetyl-6′-nitro-8′-methoxyspiro(indoline-2,2′-benzo-α-pyran),
3-ethyl-6′-nitrospiro(benzothiazoline-2,2′-benzo-α-pyran),
1,3,3-trimethyl-6′-bromospiro(indoline-2,2′-benzo-α-pyran),
1,3,3-trimethyl-6′,8′-dibromospiro(indoline-2,2′-benzo-α-pyran),
3-ethyl-6′-nitrospiro(naphtho[2,1,d]thiazoline-2,2′-benzo-α-pyran),
1,3,3-trimethyl-6′,8′-dichlorospiro(indoline-2,2′-benzo-α-pyran),
1,3-dimethyl-3-benzyl-6′-nitrospiro(indoline-2,2′-benzo-α-pyran),
3-ethyl-5-methoxy-6′-nitrospiro(benzoselenazoline-2,2′-benzo-α-pyran),
1,3,3-trimethyl-6′-bromo-8′-nitrospiro(indoline-2,2′-benzo-α-pyran),
3-ethyl-6′-bromospiro(naphtho[2,1,d]thiazoline-2,2′-benzo-α-pyran),
3-(4-sulfobutyl)-5-methoxy-6′-nitrospiro(benzoselenazoline-2,2′-benzo-α-pyran),
1,3,3-trimethyl-6′-nitro-8′-bromospiro(indoline-2,2′-benzo-α-pyran),
3-(4-sulfobutyl)-5-methoxy-6′,8′-dibromo-7′-nitrospiro(benzoselenazoline-2,2′-benzo-α-pyran),
3-(3-sulfopropyl)-5-methoxy-6′-nitrospiro(benzoselenazoline-2,2′-benzo-α-pyran),
3-(3-sulfopropyl)-6′-nitrospiro(naphtho[1,2,d]-thiazoline-2,2-benzo-α-pyran), and
3-ethyl-6′-nitrospiro(benzoselenazoline-2,2′-benzo-α-pyran).

17. The planographic printing plate material according to claim 1, wherein said Ag or Cu (B) and said organic compound (C) are deposited in amounts of 1 to 300 parts by weight and 0.3 to 30 parts by weight, respectively, based on 100 parts by weight of said inorganic material (A).

18. The planographic printing plate material according to claim 1, wherein said inorganic material (A), said Ag or Cu (B) and said organic compound (C) are each deposited as discontinuous particles having an average particles size of about 10 Å to about 0.5 micron.

19. The planographic printing plate material according to claim 1, wherein two of said inorganic material (A), said Ag or Cu (B) and said inorganic compound (C) are deposited in the form of discontinuous particles, and the remaining one of said inorganic material (A), said Ag or Cu (B) or said organic compound (C) is in the form of a layer.

20. The planographic printing plate material according to claim 1, wherein one of said inorganic material (A), said Ag or Cu (B) and said organic compound (C) is deposited in the form of discontinuous particles, and the other two of said inorganic material (A), said Ag or Cu (B) or said organic compound (C) are deposited in the form of a layer.

21. The planographic printing plate material according to claim 1, wherein said inorganic material (A) is deposited in an amount of 0.1 μg to 10 $\mu g/cm^2$, said Ag or Cu (B) is deposited in an amount of 0.1 μg to 30 $\mu g/cm^2$ and said organic compound (C) is deposited in an amount of 0.1 μg to 3 $\mu g/cm^2$.

22. The planographic printing plate material according to claim 19, wherein said inorganic material (A) is deposited in an amount of 0.1 $\mu g/cm^2$ to 10 $\mu g/cm^2$, said Ag or Cu (B) is deposited in an amount of 0.1 $\mu g/cm^2$ to 30 $\mu g/cm^2$, and said organic compound (C) is deposited at a thickness of 300 Å to 10μ.

23. The planographic printing plate material according to claim 19, wherein said inorganic material (A) is deposited in an amount of 0.1 $\mu g/cm^2$ to 10 $\mu g/cm^2$, said Ag or Cu (B) is deposited at a thickness of 300 Å to 10μ, and said organic compound (C) is deposited in an amount of 0.1 $\mu g/cm^2$ to 3 $\mu g/cm^2$.

24. The planographic printing plate material according to claim 19, wherein said inorganic material (A) is deposited at a thickness of 300 Å to 10μ, said Ag or Cu (B) is deposited in an amount of 0.1 $\mu g/cm^2$ to 30 $\mu g/cm^2$, and said organic compound (C) is deposited in an amount of 0.1 $\mu g/cm^2$ to 3 $\mu g/cm^2$.

25. The planographic printing plate material according to claim 20, wherein said inorganic material (A) is deposited in an amount of 0.1 $\mu g/cm^2$ to 10 $\mu g/cm^2$ and said Ag or Cu (B) and said organic compound (C) are each deposited at a thickness of 300 Å to 10μ.

26. The planographic printing plate material according to claim 20, wherein said Ag or Cu (B) is deposited in an amount of 0.1 $\mu g/cm^2$ to 30 $\mu g/cm^2$, and said inorganic material (A) and said orgnaic compound (C) are each deposited at a thickness of 300 Å to 10μ.

27. The planographic printing plate material according to claim 20, wherein said organic compound (C) is deposited in an amount of 0.1 $\mu g/cm^2$ to 3 $\mu g/cm^2$ and said inorganic material (A) and said Ag or Cu (B) are each deposited at a thickness of 300 Å to 10μ.

28. A process for producing a non-treatment type planographic printing plate by image-wise exposing to electromagnetic radiation the planographic printing plate material according to claim 1.

29. The planographic printing plate material according to claim 1 wherein the chalcogenide composition is selected from the group consisting of: chalcogenide compositions represented by M-sulfur Group Element which satisfy the relationship $2n/km > 1$ when the quantitative relationship between each element contained therein is considered to be $(M)_m{}^k$ (Sulfur Group Element)$_n$ [wherein k is the lowest valency which M can have, other than 0, m is the number of M] and n is the number of the Sulfur Group Element;

(ii) Chalcogenide compositions represented by M-Sulfur Group Element-X which satisfy the following relationship.

$$\frac{2n - hl}{km} > 1 \text{ (when } X \text{ is an atom which can be a positive ion) and}$$

$$\frac{2n}{km - hl} > 1 \text{ (when } X \text{ is an atom which can be a negative ion)}$$

when the quantitative relationship between each element present therein is considered to be $(M)_m{}^k$ (Sulfur Group Element)$_n(X)_l{}^h$ [wherein k, m and n each has the same meanings as defined above, h is the lowest valency which X can have, other than 0, and l is the number of X] and when X is an element which folls in the category defined as M, M in the above formula represents the element of the two elements, which is present in larger amount; and (iii) Chalcogenide compositions represented by M-Sulfur Group Element-X-Y which satisfy the following relationship;

$$\frac{2n - (hl + jp)}{km} > 1 \text{ (when both X and Y are atoms which can be positive ions)}$$

$$\frac{2n - hl}{km - jp} > 1 \text{ (when X is an atom which can be positive ion, and Y is an atom which can be a negative ion), and}$$

$$\left.\begin{array}{l} km - (hl + jp) \leqq 0 \\ \quad\text{or} \\ \dfrac{2n}{km - (hl + jp)} > 1 [\text{when } km - (hl + jp) > 0] \end{array}\right\} \text{(when both X and Y are atoms which can be negative ions)}$$

when the quantitative relationship between each element present therein is considered to be $(M)_m{}^k$ (Sulfur Group Element)$_n(X)_l{}^h(Y)_p{}^j$ [wherein k, m, n, h, l, each has the same meanings as defined above, j is the lowest valency which Y can have, other than 0, and p is the number of Y] and when X and/or Y are elements which fall in the category defined as M, M in the above formula represents the element of the two or three elements, which is present in largest amount; and wherein in the chalcogenide composition of M-Sulfur Group element-X, a content of X is not more than 30 atomic % based on the composition, and in the chalcogenide composition of M-Sulfur Group Element-X-Y, the total amount of X and Y is not more than 30 atomic % based on the total composition.

30. The planographic printing plate material according to claim 8 wherein the composition ratio of the germanium and sulfur-containing compositions is in the range of $1.5 \leqq S/Ge < 16$.

31. The planographic printing plate material according to claim 30 wherein the ratio is $1.7 \leqq S/Ge < 9$.

* * * * *